US006467063B1

(12) United States Patent
Fukuoka

(10) Patent No.: US 6,467,063 B1
(45) Date of Patent: Oct. 15, 2002

(54) REED SOLOMON CODING APPARATUS AND REED SOLOMON CODING METHOD

(75) Inventor: Toshihiko Fukuoka, Shijyonawate (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/321,553

(22) Filed: May 28, 1999

(30) Foreign Application Priority Data

Jun. 2, 1998 (JP) .......................................... 10-153196

(51) Int. Cl.[7] .......................................... H03M 13/00
(52) U.S. Cl. ................................................ 714/784
(58) Field of Search ............................. 714/784–785, 714/48, 6, 751, 768, 776, 782, 752, 759, 756

(56) References Cited

U.S. PATENT DOCUMENTS

| | | | | |
|---|---|---|---|---|
| 5,130,990 A | * | 7/1992 | Hsu et al. ..................... | 714/784 |
| 5,323,402 A | * | 6/1994 | Vaccaro et al. ............. | 714/782 |
| 5,642,367 A | * | 6/1997 | Kao ............................ | 714/784 |
| 5,878,058 A | * | 3/1999 | Im .............................. | 714/752 |
| 6,122,766 A | * | 9/2000 | Fukuoka et al. ............. | 714/784 |

FOREIGN PATENT DOCUMENTS

| | | | | |
|---|---|---|---|---|
| EP | 0 806 839 | 11/1997 | .......... | H03M/13/00 |
| JP | 6-209267 | 7/1994 | .......... | H03M/13/00 |
| JP | 7-307676 | 11/1995 | .......... | H03M/13/00 |
| JP | 9-305572 | 11/1997 | ........... | G06F/17/10 |
| JP | 9-331263 | 12/1997 | .......... | H03M/13/00 |
| JP | 10-135848 | 5/1998 | .......... | H03M/13/00 |

OTHER PUBLICATIONS

Hasan et al. (Architecture for a low complexity rate–adaptive Reed–Solomon Encoder; IEEE, Jul. 1995; pp. 938–942).*

Blaum et al. (New array codes for multiple phased burst correction; IEEE, Jan. 1993; pp. 66–77).*

Paar et al. (Comparison of arithmetic architectures for Reed–Solomon decoders in reconfigurable hardware; IEEE, Apr. 1997; Abstract).*

Sablatash (An error–correcting coding scheme for teletext and other transparent broadcasting; IEEE, Mar. 1990; pp. 65–73).*

Hasan et al. (Architecture for a low complexity rate–adaptive Reed Solomon Encoder; IEEE, Jul. 1995; pp. 938–942).*

Hasan M A Et AL: "An Architecture for a Universal Reed-solomon Encoder Using a Triangular Basis Multiplication Algorithm". Proceedings of Canadian Conference on Electrical and Computer Engineering, vol. 1, Sep. 14–17, 1993, pp. 255–258, XP002137892 Vancouver BC, Canada.

Hasan M A Et Al: "Architecture For A Low Complexity Rate–Adaptive Reed–Solomon Encoder" IEEE Transactions On Computers, US, IEEE Inc. New York, vol. 44, No. 7, Jul. 1, 1995, pp. 938–942, XP000525729 ISSN: 0018–9340.

Jain S K Et Al: "Efficient Standard Basis Reed–Solomon Encoder" IEE International Conference On Acoustics, Speech, and Signal Processing—Processings. (ICASSP), US, New York, IEEE, vol. Conf. 21, 1996, pp. 3287–3290, XP000681757 ISBN: 0–7803–3193–1.

Blahut R E: "Theory and Practice of Error Control Codes" 1983, US, Reading, Addison Wesley XP002137971 pp. 174–175.

* cited by examiner

*Primary Examiner*—Albert Decady
*Assistant Examiner*—Guy Lamarre
(74) *Attorney, Agent, or Firm*—Wenderoth, Lind & Ponack, L.L.P.

(57) ABSTRACT

There are provided a Reed Solomon coding apparatus and a Reed Solomon coding method which are capable of performing a Reed Solomon coding process in a way adapted to case where a primitive polynomial, a generator polynomial, and a number of errors to be corrected are changed. The apparatus comprises a generator polynomial coefficient generation block 1 which receives a primitive polynomial set value 4 and a generator initial value 3 as inputs, expands the generator polynomial to generate coefficient data 8 using these values, and a data coding block 2 which receives the primitive polynomial set value 4 and divides an information polynomial by the generator polynomial using the value 4, thereby coding data.

22 Claims, 7 Drawing Sheets

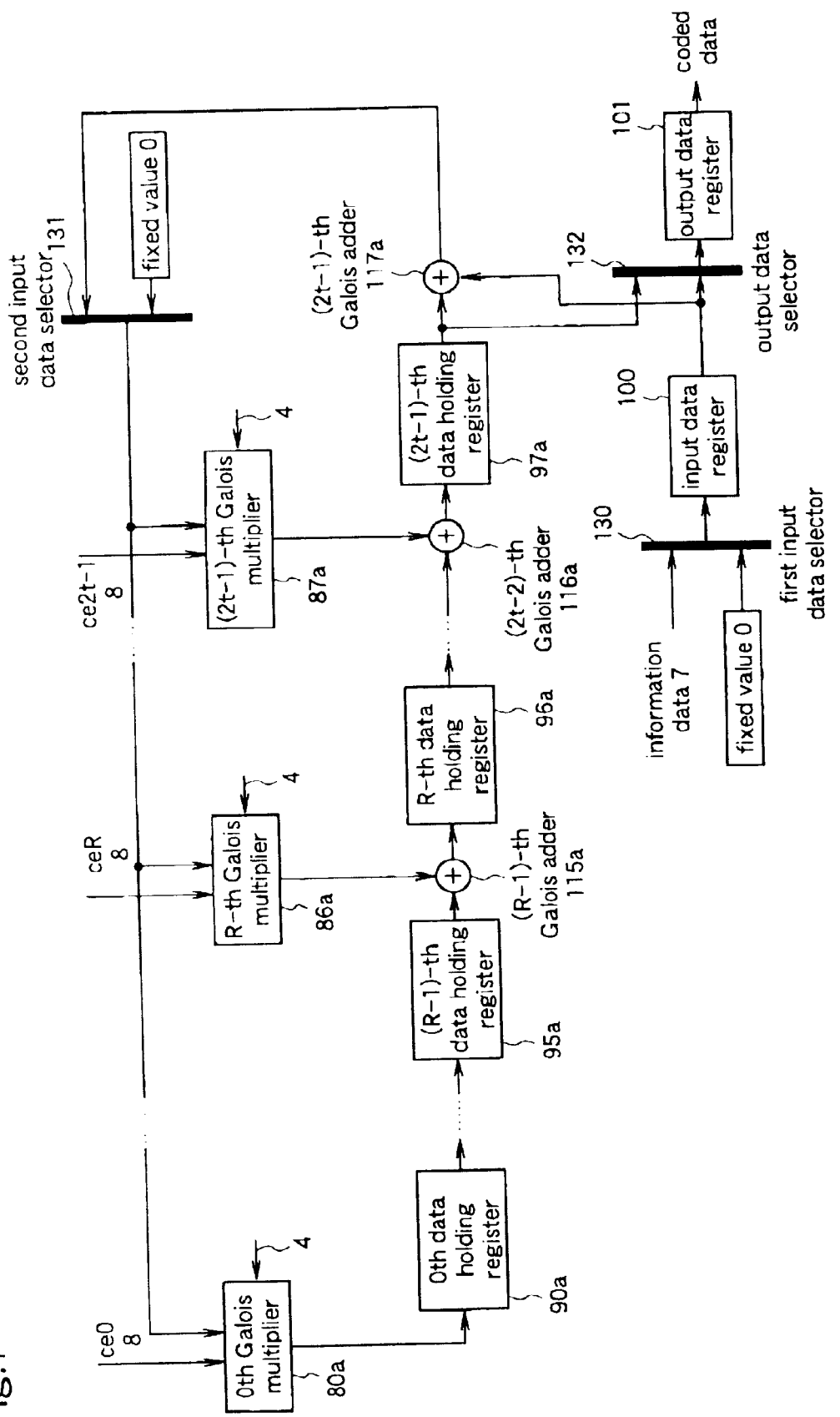

REED SOLOMON CODING APPARATUS AND REED SOLOMON CODING METHOD

FIELD OF THE INVENTION

The present invention relates to a Reed Solomon coding apparatus and a Reed Solomon coding method for correcting multiple errors, which are widely used in error correction of digital signal processing.

BACKGROUND OF THE INVENTION

As codes which enable multiple error correction for storage information in a variety of mass storages, transmission information in high-speed communication, and the like, Reed Solomon codes are widely used.

The Reed Solomon code is a code on a Galois field which contains roots $\alpha$ of P(x) (primitive polynomial)=0 as primitive elements, and is known as one type of block error-correcting code.

Consider a Reed Solomon code of a code length $n=2^m-1$ assuming that t is the number of errors to-be-corrected, m is a degree of an extended field, and primitive elements of a Galois field GF $(2^m)$ are a $\alpha^0, \alpha, \ldots \alpha^{2m-2}$. According to this code, m bits is a processing unit, i.e., a symbol. The amount of original information is (n−2t) symbols. In description below, suppose that m=8 and one symbol is represented as 8 bits (1 byte). A receiving word of one packet is composed of n symbols. The number of symbols "n" is called a code length. When t=8, the Reed Solomon code is capable of correcting eight symbol errors. The original information in the receiving word, i.e., the (n−2t) symbols are called an information word and 2t symbols added to correct errors are called a check word.

The Reed Solomon coding apparatus is adapted to add the check word of 2t symbols to the information word of (n−2t)symbols so as to generate a codeword comprising a symbol sequence of a code length n.

A description will be given of an algorithm for a coding process of the Reed Solomon code (hereinafter referred to as an RS code).

First, a primitive polynomial will be described as a first element for determining the RS code.

In case of m=8, 255 primitive elements, i.e., $\alpha^0-\alpha^{254}$ are present in the Galois field, and vector values of respective primitive elements are determined by a primitive polynomial P(z).

In general, when m=8, the primitive polynomial P(x) is expressed as:

$$P(x)=x^5+x^4+x^3+x^2+1.$$

In this case, vector values for the respective primitive elements are:

$$\alpha^0=00000001, \alpha^1=00000010, \alpha^2=00000100,$$

$$\alpha^3=00001000, \alpha^4=00010000, \alpha^5=00100000,$$

$$\alpha^6=1000000, \alpha^7=10000000, \alpha^8=00011101,$$

$$\alpha^9 00111010 \ldots.$$

Here, how these vector values are determined will be explained. When m=8, each of the vector values is represented as 8 bits. In $\alpha^0$ to $\alpha^7$, as a degree increases one by one, bit-shifting is performed to the left. $\alpha^8$ is calculated by assigning $\alpha$ to the primitive polynomial P(x) and assuming that P($\alpha$)=0, and this is expressed as:

$$P(\alpha)=\alpha^8+\alpha^4+\alpha^3+\alpha^2+1=0$$

Since addition and subtraction are the same in Galois operation, P($\alpha$)=$\alpha^8+\alpha^4+\alpha^3+\alpha^2+1=0$ is expressed as:

$$\alpha^8=\alpha^4+\alpha^3+\alpha^2+1$$

Therefore, $\alpha^8$=00011101, and $\alpha^9$ is obtained by bit-shifting $\alpha^8$ to the left.

Thus, the primitive elements have vector values determined according to a rule, where bit-shifting is performed to the left as the degree increases, and when the most significant bit is "1", the corresponding vector value is bit-shifted to the left, and then $\alpha^m\alpha^8$=00011101 is added to generate a vector value of a subsequent degree. It should be noted that addition in Galois operation corresponds to an exclusive-OR(XOR) addition of respective vector values.

The RS code is a code on the Galois field, and is determined by operation using primitive elements (255 primitive elements when m=8). Hence, if each of the primitive elements has different vector values, then different codes are obtained even if the same operational procedure is used. In other words, if different primitive polynomials are used, different RS codes are obtained.

Subsequently, a description will be given of a generator polynomial as a second element for determining the RS code.

The RS code for correcting "t" errors is generated in the following way. Express (n−2t) original information as input data in information polynomial form, and find a remainder polynomial resulting from dividing the information polynomial by a generator polynomial shown below. Then, to the (n−2t) original information data (information word), the check word of the 2t symbols calculated as the remainder polynomial is added to generate the RS code of the code length n.

The general form of the generator polynomial for the RS code for correcting the multiple errors ($n \leq 2^m-1$, the number of errors to-be-corrected is t, and a minimum distance $dmin \leq 2t+1$) is:

$$G(x) = (x-a^0)(x-a^1)(x-a^2) \ldots (x-a^{2t-1}) \quad (1)$$

$$= \prod_{i=0}^{2t-1} (x-a^i)$$

$$= x^{2t} + c_{2t-1}x^{2t-1} + c_{2t-2}x^{2t-2} + c_{2t-3}x^{2t-3} + \ldots c_2 x^2 +$$

$$c_1 x + c_0$$

"k" information data, $a_{k-1} a_{k-2} \ldots a_2, a_1, a_0$ are expressed by means of the following information polynomial:

$$I(x)=a_{k-1}x^{n-1}+a_{k-2}x^{n-2}+ \ldots +a_1x^{2t+1}+a_0x^{2t} \ldots \quad (2)$$

The expression (2) is divided by the expression (1), resulting in a remainder polynomial R(x), which becomes a check polynomial, "2t" coefficients of which become the check word. This is summarized as:

I(x)=Q(x)G(x)+R(x) (I(x): information polynomial, G(x): generator polynomial, Q(x): quotient polynomial, R(x): remainder polynomial)

In the Galois operation, addition and subtraction are the same as described above, and therefore, $$R(x)=Q(x)G(x)+I(x)=: b_{2t-1}x^{2t-1}+b_{2t-t}x^{2t-2}+b_{2t-3}x^{2t-3}+ \ldots +b_1x+b_0$$

Therefore, the whole coded polynomial X(x) is expressed as:

$$X(x)=I(x)+R(x)=a_{k-1}x^{n-1}+a_{k-2}x^{n-2}+\ldots+a_1x^{2t+1}+a_0x^{2t}+b_{2t-1}x^{2t-1}+b_{2t-2}x^{2t-2}+\ldots+b_1x+b_0\ldots \quad (3)$$

In this expression (3), n coefficients, i.e., $a_{k-1}$, $a_{k-2}$, $a_2$, $a_1$, $a_0$, $b_{2t-2}$, ... $b_1$, $b_0$ become the RS code.

As concerns an initial value "i" of the generator polynomial (1), in case of an RS code for transmission in a communication system, i=0 is generally adopted, wile in case of an RS code in a disc system, i=120 is generally adopted.

Depending upon the initial value "i", coefficients C of an expanded expression (1) vary, and thereby coefficients b of the remainder polynomial vary. Hence, like the primitive polynomial, when a different generator polynomial is used, a different RS code is generated even if the same procedure is used.

Subsequently, a description will be given of implementation of an RS coding algorithm as hardware.

The RS code is composed of the information word comprising coefficients of the information polynomial and the check word comprising coefficients of the remainder polynomial obtained by dividing the information polynomial by the generator polynomial.

When finding the remainder polynomial, in order to sequentially divide the coefficients of the information polynomial by the coefficients of the generator polynomial, it is necessary that multiplication and addition be performed using the coefficients of the information polynomial and the coefficients of respective degrees of the generator polynomial. Conventionally, hardware for implementing this division is generally constituted by Galois field multipliers and Galois field adders for performing operation on the coefficients (fixed values) of respective degrees of the generator polynomial and the coefficients of the information polynomial, and shift registers for holding operation results.

FIG. 6 is a block diagram showing a structure of an error-correcting code creating circuit in a conventional RS coding apparatus disclosed in Japanese Patent No. 2591611. Coefficients of an information polynomial as input data are sent to a register 605 in a final stage, and then multiplication results of a coefficient of a highest degree of the information polynomial and respective coefficients $g_0$–$g_{2t-1}$ are output from product circuits 611–615, i.e., multipliers, to be added to the coefficient values of the information polynomial stored in the registers 601–605, respectively. This makes one division and moves the content stored in each of the registers 601–605 one by one. This division is sequentially repeated to find a quotient polynomial, and values remaining in the registers 601–604 without being transferred to the register 605 become coefficients of a remainder polynomial.

As the coefficients of the generator polynomial, prefound fixed values are used. For this reason, as the multipliers for performing Galois field multiplication on the coefficients of the generator polynomial and the coefficients of the information polynomial, fixed-value multipliers called "coefficient units" are used. The coefficient units implement multiplication by bit-shift operation, because the RS code is a cyclic code.

However, the rule of the bit-shift operation by the coefficient units is determined by the primitive polynomial. Specifically, this is determined by $\alpha^m$. Therefore, when the same fixed-value multiplication is performed but a different primitive polynomial is used, bit-shift operation must be changed. For this reason, if the primitive polynomial is changed, the corresponding error-correcting code cannot be created. In this case, in order to create the error-correcting code, coefficient units adapted to the corresponding primitive polynomial and a multiplier including the same needs to be provided.

In addition, the initial value "i" of the generator polynomial (1) varies from system to system. As mentioned previously, in the communication system, i=0 or 1 is commonly used, while in the disc system, i=120 is commonly used. The coefficients C of the respective degrees of the generator polynomial (1) have fixed values when the initial value "i" is fixed, whereas if the "i" changes, then the fixed values of the coefficient values C are changed. Therefore, if the generator polynomial is changed, coefficients of respective degrees adapted to the corresponding generator polynomial need to be provided. However, conventionally, coefficient values of the generator polynomial are prefound, and division of the information polynomial is performed using these values, which makes it impossible to create the error-correcting code if a different generator polynomial is used.

Further, when the number of errors to-be-corrected is changed, it is required that the number of stages in the error-correcting code creating circuit be correspondingly changed. For instance, assuming that the number of errors is reduced by one in the example shown in FIG. 6, the number of stages needs to be set to (2t-2). The number of stages cannot be changed in the conventional RS coding apparatus including the error-correcting code creating circuit shown in FIG. 6, and thereby the number of errors to-be-corrected cannot be changed.

Thus, in the conventional Reed Solomon coding apparatus and Reed Solomon coding method, although operation is carried out using the same algorithm and the same procedure, the RS coding process cannot be performed if the primitive polynomial, the generator polynomial, or the number of errors to-be-corrected is changed. If handling a case where the primitive polynomial, the generator polynomial, or the number of errors to-be-corrected is changed, it becomes extremely difficult to share the hardware, and therefore the coefficient units according to these changes need to be provided, resulting in a large-scale circuit. For this reason, an RS encoder for one type of primitive polynomial and generator polynomial has been very commonly used.

SUMMARY OF THE INVENTION

It is an object of the present invention to provide a Reed Solomon coding apparatus and a Reed Solomon coding method which are capable of performing a Reed Solomon coding process in a way adapted to a case where a primitive polynomial, a generator polynomial, and the number of errors to-be-corrected are changed.

Other objects and advantages of the present invention will become apparent from the detailed description given hereinafter. It should be understood, however, that the detailed description and specific embodiment are given by way of illustration only, since various changes and modifications within the scope of the invention will become apparent to those skilled in the art from this detailed description.

According to a first aspect of the present invention, a Reed Solomon coding apparatus comprises: generator polynomial coefficient generation means which receives a generator initial value corresponding to a primitive element with a minimum power of roots corresponding to powers of a which are obtained by setting a generator polynomial to be zero, and a primitive polynomial set value corresponding to a value of an $\alpha^m$, when a degree of an extended field is m (m≧1 m: integer) and one of primitive elements is $\alpha$, as inputs, and expands the generator polynomial according to change of at least one of the generator initial value and the primitive polynomial set value to generate coefficient data comprising coefficients of respective degrees; and data coding means which receives information data and the coefficient data as inputs, divides the information data by the coefficient data according to change of either the, generator initial value or the primitive polynomial set value to obtain remainder data, arid couples the remainder data and the information data to form Reed-Solomon coded data. Therefore, when the primitive polynomial or the generator polynomial is changed, the generator initial value or the primitive polynomial set value adapted to the corresponding polynomial is input. Thereby, it is possible to provide a Reed Solomon coding apparatus in which the generator polynomial is expanded to generate coefficient data comprising coefficients of respective degrees and a Reed solomon coding process is performed for the information data in a way adapted to a case where the primitive polynomial or the generator polynomial is changed.

According to a second aspect of the present invention, the generator polynomial coefficient generation means and the data coding means each comprises a plurality of multipliers, and the multipliers each comprises coefficient units serially connected in (m−1) stages, the coefficient units each performing multiplication on the primitive element a by using combination of a bit-shifted primitive element a and an exclusive-OR of the bit-shifted primitive element a and the primitive polynomial set value $\alpha^m$. Therefore, when the primitive polynomial is changed, the corresponding primitive polynomial set value is input, whereby Galois multiplication is performed according to a new primitive polynomial. Thereby, it is possible to provide a Reed Solomon coding apparatus which is capable of performing a Reed Solomon coding process in a way adapted to a case where the primitive polynomial is changed.

According to a third aspect of the present invention, the coefficient units each outputs a vector value obtained by shifting a vector value of the generator initial value by one bit to the left every time it performs multiplication on the primitive element $\alpha$, and when the most significant bit is 1, the coefficient unit outputs an exclusive-OR of the bit-shifted primitive element $\alpha$ and the primitive polynomial set value $\alpha^m$ when the corresponding degree increases. Therefore, when the primitive polynomial is changed, the corresponding primitive polynomial set value is input, whereby Galois multiplication is performed according to a new primitive polynomial. Thereby, it is possible to provide a Reed Solomon coding apparatus which is capable of performing a Reed Solomon coding process in a way adapted to a case where the primitive polynomial is changed.

According to a fourth aspect of the present invention, the generator polynomial coefficient generation means comprises, when a number of errors to be corrected is t ($t \geq 1$ t: integer): a 2t-th multiplier which repeats multiplication by the primitive element $\alpha$ with respect to the generator initial value, and outputs a multiplication result for each multiplication; a 0th multiplier which performs multiplication on the generator initial value and the multiplication result of the 2t-th multiplier, and then repeats multiplication on the resulting multiplication result and the multiplication result of the 2t-th multiplier; a 0th register which updates and holds output data of the 0-th multiplier: a first adder which receives output data of the 0-th register on one input and performs addition on two inputs; a first register which updates and holds output data of the first adder; a first multiplier which performs multiplication on output data of the first register and output data of the 2t-th multiplier and outputs a multiplication result to the other input of the first adder; an N-th adder which receives output data of an (N−1)-th register ($2t-1 \geq N \geq 2$ N : integer) on one input, and performs addition on two inputs: an N-th register which updates and holds output data of the N-th adder; and an N-th multiplier which performs multiplication on output data of the N-th register and output data of the 2t-th multiplier, and outputs a multiplication result to the other input of the N-th adder, wherein data held in the 0-th to (2t−1)-th registers are output as coefficient data of the generator polynomial. Therefore, when the generator polynomial is changed, the corresponding generator initial value is input, whereby a new generator polynomial is expanded to generate coefficient data. Thereby, it is possible to provide a Reed Solomon coding apparatus which is capable of performing a Reed Solomon coding process in a way adapted to a case where the generator polynomial is changed.

According to a fifth aspect of the present invention, the data coding means comprises, when a number of errors to be corrected is t ($t \geq 1$ t: integer) a 0th multiplier which performs multiplication on a value of a 0th degree of the coefficient data of the generator polynomial and the information data; a 0th register which holds output data of the 0th multiplier; an R-th multiplier which performs multiplication on a value of an R-th degree ($2t-2 \geq R \geq 1$) of the coefficient data of the generator polynomial and the information data; an (R−1)-th adder which performs addition on output data of the R-th multiplier and data held in an (R-1)-th register; an R-th register which holds output data of the (R−1)-th adder; a (2t-1)-th multiplier which performs multiplication on a value of a (2t-1)-th degree of the coefficient data of the generator polynomial and the information data; a (2t−2)-th adder which performs addition on output data of the (2t−1)-th multiplier and data held in a (2t−2)-th register; a (2t−1)-th register which holds on output data of the (2t−2)-th adder; and a (2t−1)-th adder which performs addition on output data of the (2t−1)-th register and the information data. Thereby, it is possible to provide a Reed Solomon coding apparatus which is capable of performing a Reed Solomon coding process in a way adapted to a case where the primitive polynomial is changed.

According to a sixth aspect of the present invention, the coefficient unit comprises registers which shift bits other than the most significant bit of the input data to be multiplied and hold bit-shifted data, and add zero as the lowest data to the bit-shifted data and output addition data; and a selector which receives the most significant bit of the input data as an input, and selects and outputs an exclusive-OR of the primitive polynomial set value and output data of the registers when the most significant bit is 1, and selects and outputs the output data of the registers when the most significant bit is zero. Thereby, it is possible to provide a Reed Solomon coding apparatus which is capable of performing a Reed Solomon coding process in a way adapted to a case where the primitive polynomial is changed.

According to a seventh aspect of the present invention, the generator polynomial coefficient generation means receives a number t of errors to be corrected as an input and expands the generator polynomial according to change of the number t, to generate coefficient data comprising coefficients of respective degrees, and the data coding means receives the number t as an input and divides the information data according to change of the number t. Therefore, it is possible to provide a Reed Solomon coding apparatus in which the generator polynomial is expanded and the information data is divided to obtain remainder data according to change of the number t of errors to-be-corrected, and thereby the Reed Solomon coding process is performed according to change of the number t.

According to an eighth aspect of the present invention, the data coding means comprises, when a maximum number of errors to be corrected is s (s≧t s: integer): a 0th multiplier which performs multiplication on a value of a 0th degree of the coefficient data of the generator polynomial and the information data; a 0th register which holds output data of the 0th multiplier; a (2M−1)-th multiplier which performs multiplication on a value of a (2M−1)-th (s−1≧M≧1 M: integer) of the coefficient data of the generator polynomial and the information data; a 2M-th multiplier which performs multiplication on a value of a 2M-th degree of the coefficient data of the generator polynomial and the information data; a (2M−1)-th adder which performs addition on output data of the 2M-th multiplier and data held in a (2M−1)-th register; a 2M-th selector which selects one of output data of the (2M−1)-th adder and output data of the 2M-th multiplier; a 2M-th register which holds output data of the 2M-th selector; a (2s−1)-th multiplier which performs multiplication on a value of a (2s−1)-th degree of the coefficient data of the generator polynomial and the information data; a (2s−2)-th adder which performs addition on output data of the (2s−1)-th multiplier and data held in the (2s−2)-th register; and a (2s−1)-th register which holds output data of the (2s−2)-th adder, wherein a (2(s−t))-th selector selects output data of a (2(s−t))-th multiplier, with respect to the number t of errors to be corrected. Therefore, it is possible to provide a Reed Solomon coding apparatus which is capable of a Reed Solomon coding process according to change of the number t of errors to-be-corrected.

According to a ninth aspect of the present invention, in a Reed Solomon coding method, a generator initial value corresponding to a primitive element with a minimum power of roots corresponding to powers of a which are obtained by setting a generator polynomial to be zero, and a primitive polynomial set value corresponding to a value of an $\alpha^m$, when a degree of an extended field is m (m≧1 m: integer) and one of primitive element is α, are received as inputs, and the generator polynomial is expanded according to change of at least one of the generator initial value and the primitive polynomial set value, to generate coefficient data comprising coefficients of respective degrees; and information data and the coefficient data are received as inputs, the information data is divided by the coefficient data according to change of either the generator initial value or the primitive polynomial set value to obtain remainder data, and the remainder data and the information data are coupled to form Reed-Solomon coded data. Therefore, when the primitive polynomial or the generator polynomial is changed, the generator initial value or the primitive polynomial set value adapted to the corresponding polynomial is input. Thereby, it is possible to provide a Reed Solomon coding method which is capable of a Reed Solomon coding process in a way adapted to a case where the primitive polynomial or the generator polynomial is changed.

According to a tenth aspect of the present invention, the generator polynomial is expanded according to change of an input number t of errors to be corrected (t≧1 t: integer), and the information data is divided according to change of an input number t. Therefore, it is possible to provide a Reed Solomon coding method which is capable of a Reed Solomon coding process according to change of the number t of errors to-be-corrected.

BRIEF DESCRIPTION OF THE DRAWINGS

FIG. 7 is a diagram showing a structure of modification of the data coding block included in the Reed Solomon coding apparatus of the embodiment.

DETAILED DESCRIPTION OF THE PREFERRED EMBODIMENTS

Figure 1:
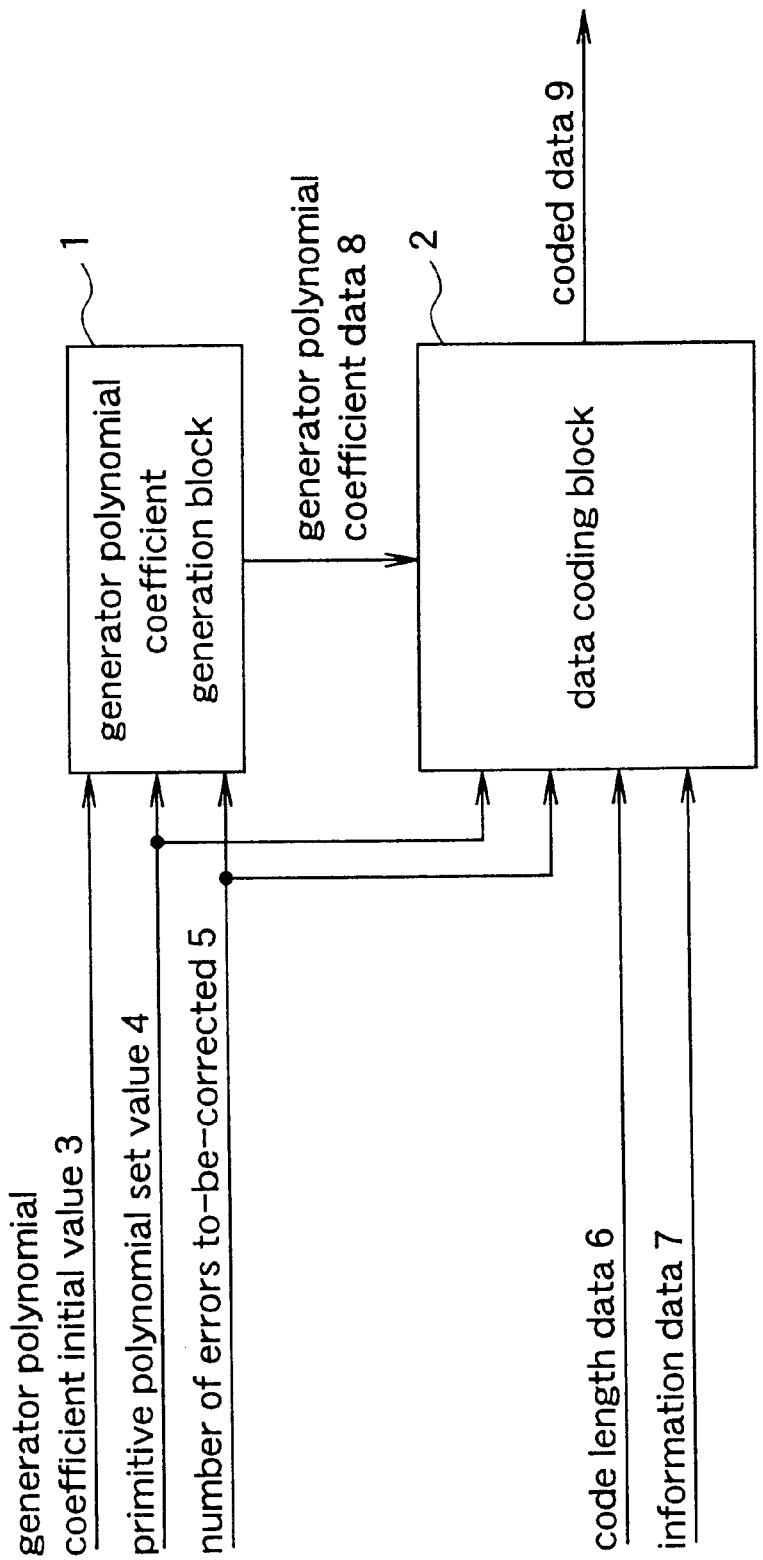
FIG. 1 is a block diagram showing a structure of a Reed-Solomon coding apparatus according to an embodiment of the present invention.

FIG. 1 is a block diagram showing a structure of a Reed Solomon coding apparatus according to an embodiment of the present invention, wherein two functional blocks, namely, a generator polynomial coefficient generation block 1 and a data coding block 2 are shown. The generator polynomial coefficient generation block 1 receives a generator polynomial coefficient generator initial value (generator initial value) 3, a primitive polynomial set value 4, and data 5 indicating the number of errors to-be-corrected, as inputs, and, outputs generator polynomial coefficient data 8 to the data coding block 2. The data coding block 2 receives the primitive polynomial set value 4, the data 5 for defining the number t when the maximum value of errors to-be-corrected is s (s≧t≧1 t : integer), code length data 6, information data 7, and the generator polynomial coefficient data 8 as inputs, and outputs coded data 9 which has been subjected to the Reed Solomon coding process.

Hereinafter, the Reed Solomon coding apparatus of the embodiment will be described. For convenience, suppose that the number of errors to-be-corrected t=10, the code length data 6, i.e., the code length of the information data 7 is 255, and a degree of an extended field m=8.

Initially, we will refer to the generator polynomial:

$$G(x)=(x-\alpha^0)(x-\alpha^1)(x-\alpha^2)\ldots(x-\alpha^{2t-1})$$

By assigning 10 to t, $$G(x)=(x-\alpha^0)(x-\alpha^1)(x-\alpha^2)\ldots(x-\alpha^{19})$$

Further, as the primitive polynomial:

$$P(x)=x^8+x^4+x^3+x^2+1.$$

As already described in the description of the prior art, the primitive elements have the vector values determined according to a rule and bit-shift is performed to the left with an increase in the degree. When the most significant bit is "1", the corresponding vector value is bit-shifted to the left, and then the vector value of $\alpha^m$ is added to generate a vector value of a subsequent degree. So, one of elements of the primitive element α, for example, $\alpha^m=\alpha^8$ is found and used for Galois operation as the primitive polynomial set value 4.

For instance, using the above primitive polynomial P(x) and assuming that P(α)=0, $$\alpha^8=\alpha^4+\alpha^3+\alpha^2+1$$

$\alpha^8$ is expressed in terms of a vector as:

$\alpha^8 = 00011101$

The vector value of this $\alpha^8$ is given in hexadecimal as "1d", which is input as the primitive polynomial set value 4, to perform coding operation. As complementary explanation, if $P(x)=x^8+x^7+x^2+1$, then $\alpha^8=10000111$, and the primitive polynomial set value 4 is given as "87" in hexadecimal. Thus, the primitive polynomial set value 4 varies depending upon the primitive polynomial.

Now, let's find a primitive element with a minimum power of roots corresponding to powers of $\alpha$ which are obtained by setting the generator polynomial to be zero as the generator polynomial generator initial value 3. By way of example, $G(x)=(x-\alpha^0)(x-\alpha^1)(x-\alpha^2)\ldots(x-\alpha^{19})$ In this example, the generator initial value 3 is obtained by giving a vector value of $\alpha^0$ in hexadecimal. As another example, $G(x)=(x-\alpha^{120})(x-\alpha^{121})(x-\alpha^{122})\ldots(x-\alpha^{139})$ In this example, the generator initial value 3 is obtained by giving a vector value of $\alpha^{120}$ in hexadecimal. This hexadecimal is determined by the primitive polynomial. As examples:

When $P(x)=x^8+x^4+x^3+x^2+1$, $\alpha^{120}$="3b".

When $P(x)=x^8+x^7+x^2+x+1$, $\alpha^{120}$="el".

The generator initial value 3 is thus found according to the generator polynomial to be used. Note that "01" is obtained irrespective of the primitive polynomial when $\alpha^0$ is the generator initial value 3.

A description will be given of respective data. For the sake of simplicity, in this embodiment, assume that the initial value 3 of the generator polynomial is "01" (hexadecimal notation), the primitive polynomial set value 4 is "1d" (hexadecimal notation), the number 5 of errors to-be-corrected is t=10 (decimal notation), and the code length data 6 is 255 (decimal notation). As for the information data 7, assume that byte data is sequentially input.

A description will be given of an outline of the generator polynomial coefficient generation block 1. The block 1 is adapted to expand the generator polynomial. First, based on the generator initial value 3, the block 1 multiplies this by $\alpha$ to generate $\alpha^1$. Using this generated value $\alpha^1$, the block 1 calculates coefficients of an expression into which the following two terms are expanded:

$(x^2-Ax-B)(x-\alpha^2)(A=\alpha^0+\alpha^1, B=\alpha^0\times\alpha^1)$

Specifically, the block 1 calculates $(\alpha^0+\alpha^1)$, $(\alpha^0\times\alpha^1)$ and holds calculated data. Then, based on the held $\alpha$, the block 1 multiplies this by $\alpha$ to generate $\alpha^2$. Holding the $\alpha^2$, the block 1 calculates the coefficients. That is, the block 1 calculates $(A+\alpha^2)$, $(A\times\alpha^2+B)$, $(B\times\alpha^2)$, and holds respective values.

In this manner, the block 1 calculates $\alpha^3$, $\alpha^4$, ..., primitive elements on the Galois field required for expanding the generator polynomial. Simultaneously, the block 1 repeats expansion of respective terms of the G(x) to find coefficients, calculates and holds 20 values except the highest-degree coefficient "1". Then, the block 1 outputs these values to the data coding block 2 as the generator polynomial coefficient data 8. A detailed structure of the block 1 will be discussed later.

Subsequently, a description will be given of the data coding block 2. Since the code length is 255 and the number of errors to-be-corrected is 10, the data coding block 2 sequentially receives (255−2×10=235) information data 7 as inputs. Assuming that the information data are $a_{234}$, $a_{233}$, ..., $a_0$, as discussed in description of the prior art, the information polynomial is expressed as:

$I(x)=a_{234}x^{254}+a_{233}x^{253}+\ldots+a_1x^{21}+a_0x^{20}$

Assuming that coefficient data 8 calculated and input by the block 1 is $c_{19}$, $c_{18}$, ... $c_0$, the generator polynomial is expressed as:

$G(x)=x^{20}+c_{19}x^{19}+c_{18}x^{18}+c_{17}x^{17}+\ldots+c_2x^2+c_1x+c_0$

The data coding block 2 has a capability of dividing the I(x) by G(x) to obtain the remainder polynomial R(x), and outputting coefficient data of a Reed-Solomon coded polynomial X(x) (I(x)+R(x)) Using the polynomials, $I(x)=Q(x)G(x)+R(x)$, and therefore, $R(x)=Q(x)G(x)+I(x)=b_{19}x^{19}+b_{18}x^{18}+\ldots+b_1x+b_0$ Therefore, the coded polynomial is:

$X(x)=T(x)+R(x)=a_{234}x^{234}+a_{233}x^{233}+\ldots+a_1x^{21}+a_0x^{20}+b_{19}x^{19}+b_{18}x^{18}+\ldots+b_1x+b_0$ As Reed-Solomon coded data, coefficients of the coded polynomial, i.e.,255 data ($a_{234}$, $a_{233}$ ... $a_0$, $b_{19}$, $b_{18}$, ... $b_{17}$) are output. The remainder polynomial R(x) is found by dividing the coefficients of respective degrees of the information polynomial by the coefficients of respective degrees of the generator polynomial. An internal structure of the data coding block 2 will also be described in detail later.

Figure 2:
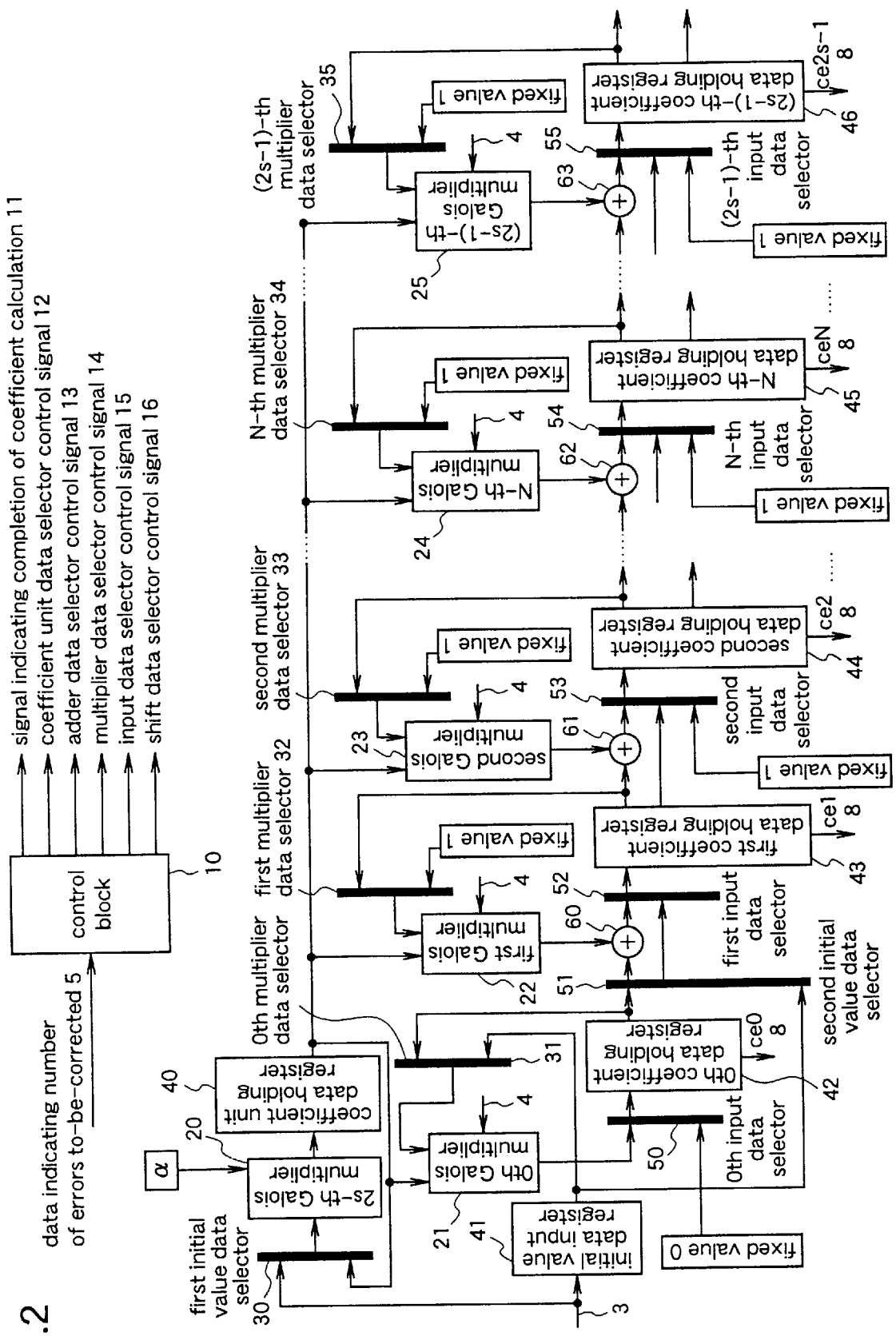
FIG. 2 is a diagram showing a structure of a generator polynomial coefficient generation block included in the Reed Solomon coding apparatus of the embodiment.

FIG. 2 is a circuit diagram showing the structure of the generator polynomial coefficient generation block 1. The block 1 comprises a control block 1 which controls calculation of coefficients, 2s Galois multipliers 21–25 (0th, first, second, N-th, and (2s−1)-th (3≦N≦2s−2) N : integer), a 2s-th Galois multiplier 20 which perform multiplication on $\alpha$, (2s−1) Galois adders 60–63 (first, second, N-th, and (2s−1)-th), 2s coefficient data holding registers 42–46 (0th, first, second, N-th, (2s−1)-th), an initial value data input register 41 which expands the generator polynomial, a coefficient unit data holding register 40, first and second initial value data selectors 30 and 51, 2s input data selectors 50, and 52–55 (0th, first, second, N-th, (2s−1)-th), and 2s multiplier data selectors 31–35 (0th, first, second, N-th, (2s−1)-th).

Since the number of coefficients of respective degrees of the generator polynomial and values for the coefficients vary depending upon the number t of errors to-be-corrected the control block 10 checks a redundant byte length of the information data 7 according to the data 5 for defining the number t, and outputs a signal 11 indicating completion of generation of coefficients to the first and second initial value data selectors 30 and 51. The control block 10 also outputs an input data selector control signal 15 for controlling the 0th input data selector 50, a shift data selector control signal 16 for controlling the first to (2s−1)-th input data selectors 52–55, and a multiplier data selector control signal 14 for controlling the 0th to (2s−1)-th multiplier data selectors 31–35.

The initial value data input register 41 receives and holds the generator initial value data 3 with which the generator polynomial is expanded, and outputs the initial value data 3 to the 0th multiplier data selector 31 and the second initial value data selector 51. The first initial value data selector 30 selects one of the generator initial value data 3 and output data of the coefficient unit data holding register 40, and outputs the-selected data to the 2s-th Galois multiplier 20.

The 2s-th Galois multiplier 20 multiplies the selected data of the data selector 30 by the primitive element α as a fixed value according to a Galois operation rule adapted to the primitive polynomial and sends a multiplication result to the register 40, which holds this data, and then outputs this data to the data selector 30 and the 0th Galois multiplier 21.

The 0th Galois multiplier 21 performs Galois operation on output data of the register 40 and output data of the data selector 31, and outputs a multiplication result to the 0th input data selector 50.

The 0th input data selector 50 selects either the output data of the 0th Galois multiplier 21 or the fixed value "0", and outputs the selected data to the 0th coefficient data holding register 42, which holds the output data of the data selector 50, and then outputs this data to the second initial value data selector 51 and the 0th multiplier data selector 31, which selects either data output from the register 41 or the register 42, and outputs the selected data to the 0th Galois multiplier 21.

The data selector 51 selects either data output from the register 41 or data output from the 0th coefficient data holding register 42, and outputs the selected data to the first input data selector 52 and the first Galois adder 60.

The first Galois multiplier 22 receives output data of the register 40 and output data of the data selector 32 as inputs, performs Galois multiplication on these according to the Galois operation rule adapted to the primitive polynomial, and outputs a multiplication result to the first Galois adder 60. The second Galois multiplier 23 performs Galois multiplication on output data of the register 40 and output data of the second multiplier data selector 33 according to the Galois operation rule adapted to the primitive polynomial, and outputs a multiplication result to the second Galois adder 61. The N-th (2s−2≧N≧3 N: integer) Galois multiplier 24 receives output data of the register 40 and output data of the N-th multiplier data selector 34 as inputs and performs multiplication on these according to the Galois operation rule adapted to the primitive polynomial, and outputs a multiplication result to the N-th Galois adder 62. The (2s−1)-th Galois multiplier 25 receives the output data of the register 40 and output data of the data selector 35 as inputs and performs multiplication on these according to the Galois operation rule adapted to the primitive polynomial, and outputs a multiplication result to the (2s−1) Galois adder 63 The first multiplier data selector 32 selects either output data of the first register 43 or a fixed value "1" and outputs the selected data to the first Galois multiplier 22. The second multiplier data selector 33 selects either output data of the second register 44 or the fixed value 1, and outputs the selected data to the second Galois multiplier 23. The N-th multiplier data selector 34 selects either output data of the N-th register 45 or the fixed value 1, and outputs the selected data to the N-th Galois multiplier 24. The (2s−1)-th multiplier data selector 35 selects either output data of the (2s−1)-th register 46 or the fixed value 1, and outputs the selected data to the (2s−1) Galois multiplier 25.

The first Galois adder 60 receives output data of the first Galois multiplier 22 and output data of the second data selector 51 as inputs, and performs Galois addition on these and outputs an addition result to the first input data selector 52. The second Galois adder 61 receives output of the second Galois multiplier 23 and the output data of the first data register 43 as inputs, and performs Galois addition on these and outputs an additional result to the second input data selector 53. The N-th Galois adder 62 receives output data of the N-th Galois multiplier 24 and output data of a (N−1)-th register as inputs, performs Galois addition on these and outputs an addition result to the N-th input data selector 54. The (2s−1)-th Galois adder 63 receives output data of the (2s−1)-th Galois multiplier 25 and output data of the (2s−2)-th register as inputs, and performs Galois addition on these and outputs an addition result to the (2s−1)-th input data selector 55.

The first input data selector 52 selects either output data of the second data selector 51 or the output data of the first Galois adder 60, and outputs the selected data to the first register 43. The second input data selector 53 selects either output data of the first register 43, output data of the second Galois adder 61, or the fixed value 1, and outputs the selected data to the second register 44. The N-th input data selector 54 selects either output data of an (N−1)-th coefficient data holding register, output data of the N-th Galois adder 62, or the fixed value 1, and outputs the selected data to the N-th register 45. The (2s−1)-th input data selector 55 selects output data of a (2s−2)-th coefficient data holding register, output data of the (2s−1)-th Galois adder 63, or the fixed value 1, and outputs the selected data to the (2s−1)-th coefficient data holding register 46.

The first register 43 receives and holds the output data of the first input data selector 52, and then outputs this data to the second Galois adder 61, the first multiplier data selector 32, and the second input data selector 53. The second register 44 receives and holds the output data of the second input data selector 53, and then outputs this data to a third Galois adder, the second multiplier data selector 33, and a third input data selector. The N-th register 45 receives and holds the output data of the N-th input data selector 54, and then outputs this data to a (N+1)-th Galois adder, the N-th multiplier data selector 34, and a (N+1)-th input data selector. The(2s−1)-th register 46 receives and holds the output data of the (2s−1)-th input data selector 55, and then outputs this data to the (2s−1)-th multiplier data selector 35.

Data held in the 2s registers 42–46 (the 0th to the (2s−1)-th) are output as 2s generator polynomial coefficient data 8 (0th to (2s−1)-th) resulting from expansion of the generator polynomial. Data of the (2s−1)-th register 46 becomes coefficient data of a higher degree. These registers 42–46 hold and output data when the signal 11 indicating completion of calculation of coefficients becomes active.

A description will be given of operation of the block 1. Here it is assumed that the number of errors "t" to-be-corrected is kept constant, and the number "t"=the maximum number "s". The generation polynomial is given by:

$$G(x)=(x-\alpha^0)(x-\alpha^1)(x-\alpha^2)\ldots(x-\alpha^{19})$$

The primitive element with the minimum power of roots corresponding to powers of α which are obtained by setting the generator polynomial to be zero, i.e., "$\alpha^0$", as the generator initial value 3, is input to the initial value data input register 41 and the first initial value data selector 30. The data "$\alpha^0$" is held in the register 41, while the data "$\alpha^0$" input to the selector 30 is multiplied by α by the corresponding coefficient unit to generate data "$\alpha^1$", which is held in the coefficient unit data holding register 40, which outputs the data "$\alpha^1$" to the 0th to 19th Galois multipliers 21–25.

As described above, in this block, $(x-\alpha^0)(x-\alpha^1)$ is first calculated, and therefore, it is necessary that $(\alpha^0+\alpha^1)$, and $(\alpha^0+\alpha^1)$ be found. So, let's take note of the 0th Galois multiplier 21 and the first Galois multiplier 22. Since the 0th Galois multiplier 21 receives the $\alpha^1$ on one input from the register 40, the control block 10 performs control so that the data selector 31 selects the output data of the input register 41 for the other input. Thereby, the 0th Galois multiplier 21 conducts a $(\alpha^0 \times \alpha^1)$ and sends a multiplication result to the 0th input data selector 50, which outputs the multiplication result to the 0th register 42, to be held therein.

The Galois multipliers 20–25 perform multiplication according to the Galois operation rule adapted to the primitive polynomial determined by the primitive polynomial set value 4. The structures and operation of the Galois multipliers 20–25 will be described later.

Since the first Galois multiplier 22 receives the $\alpha^1$ on one input from the register 40, the control block 10 performs control so that the first multiplier data selector 32 selects the fixed value "1" for the other input. Thereby, the $\alpha^1$ is output from the first Galois multiplier 22 to the first Galois adder 60. The control block 10 performs control so that the second data selector 51 selects output data of the register 42 for the other input of the first Galois adder 60, and thereby the $\alpha^0$ is input thereto. As a result, the first Galois adder 60 carries out $(\alpha^0 + \alpha^1)$, and an addition result is sent through the first input data selector 52 to the first holding register 43, to be held therein.

Then, assuming that $\alpha^0 + \alpha^1 = A$, $\alpha^0 \times \alpha^1 = B$, $(x^2 - Ax - B)(x - \alpha^2)$ is expanded to calculate coefficients of respective degrees, i.e., $(A + \alpha^2)$, $(A \times \alpha^2 + B)$, and $(B \times \alpha^2)$.

Since the $\alpha^1$ held in the register 40 is input to the first data selector 30, the selector 30 selects the output data of the register 40 rather than the generator polynomial initial value data 3. Thereby, the output data of the selector 30 is multiplied by a by the 2s-th Galois multiplier 20 to generate $\alpha^2$, which is held in the register 40. Therefore, the 0th to 19th Galois multipliers 21–25 receive $\alpha^2$ on their respective inputs.

Let's focus attention on the 0th Galois multiplier 21, the first Galois multiplier 22, and the second Galois multiplier 23. The 0th multiplier data selector 31 which determines data to be input to the other input of the 0th Galois multiplier 21, selects either the output data of the register 41 or the output data of the register 42. The register 41 holds the initial value data 3, and the register holds the coefficient data $B = \alpha^0 \times \alpha^1$ which has been generated by previous calculation. So, the selector 31 selects the coefficient data B held in the register 42 and inputs this to the 0th Galois multiplier 21, which carries out $(B \times \alpha^2)$, while the 0th input data selector 50 selects output of the 0th Galois multiplier 21 and updates the data of the register 42, which holds the $(B \times \alpha^2)$, The first multiplier data selector 32 which determines the other input data for the first Galois multiplier 22, selects output data $(A = \alpha^0 + \alpha^1)$ of the first register 43 as input data on the other input of the first Galois multiplier 22, which carries out $(A \times \alpha^2)$ and outputs a multiplication result to the first Galois adder 60. The second initial value data selector 51 which determines the other input data for the first Galois adder 60, selects the data $B = \alpha^0 \times \alpha^1$ held in the 0th register 42 which has been generated by previous calculation, and the first Galois adder 60 carries out $(A \times \alpha^2 + B)$. The first input data selector 52 selects the output of the adder 60 and the first register 43 holds the $(A \times \alpha^2 + B)$.

The second multiplier data selector 33 which determines the input data for the other input of the second Galois multiplier 23, selects the fixed value "1", and thereby the second Galois multiplier 23 outputs the $\alpha^2$ input from the register 40 to the second Galois adder 61. Since input data for the other input of the second Galois adder 61 is the output data $(A = \alpha^0 + \alpha^1)$ of the first register 43, the adder 61 carries out $(A + \alpha^2)$ and, and an addition result is sent through the second input data selector 53 to the second holding register 44.

As values of the register 40 are updated like $\alpha^3$, $\alpha^4, \ldots, \alpha^9$, as with the above calculation, the third Galois multiplier, the fourth Galois multiplier, ... the 19th Galois multiplier are sequentially used to update values of the 0th to 19th coefficient data holding registers 42–46.

When the value of the register 40 reaches $\alpha^{19}$, and calculation of the respective coefficients is completed, the signal 11 output from the control block 10 becomes active and thereby the values of the registers 42–46 are placed in a hold state. The coefficient values ce1–ce19 are output as the generator polynomial coefficient data 8.

The above repeated operation sequentially expands the following generator polynomial:

$$G(x) = (x - \alpha^0)(x - \alpha^1)(x - \alpha^2)(x - \alpha^{19}),$$

resulting in:

$$G(x) = x^{20} + c_{19}x^{19} + c_{18}x^{18} + c_{17}x^{17} + \ldots + c_2 x^2 + c_1 x + c_0$$

This expression has 20 coefficients ($c_0 - c_{19}$). Data $ce_{19}$ held in the register 46 corresponds to the coefficient $c_{19}$ of a higher degree and Data $ce_0$ held in the register 42 corresponds to the coefficient $c_0$ of a lower degree.

When the generator polynomial is changed, instead of the $\alpha^0$ as the generator initial value 3, an element with a minimum power of roots corresponding to powers of $\alpha$ which are obtained by setting the corresponding generator polynomial to be zero, is input as the generator initial value 3, whereby the generator polynomial is expanded to generate coefficients in the same manner as described above.

As should be appreciated from the forgoing description, in accordance with the embodiment, the generator polynomial coefficient generation block 1 is provided for expanding the generator polynomial by the use of the generator initial value 3 as the input thereby obtaining the coefficient data 8. Since the initial value 3 is prefound such that it is adapted to the corresponding generator polynomial, and input, whereby for each of different generator polynomials, coefficients of respective degrees can be calculated, and, thereby coefficient data 8 adapted to each generator polynomial can be output to the data coding block 2. As a result, the Reed Solomon coding process can be carried out if the generator polynomial is changed.

Figure 3:
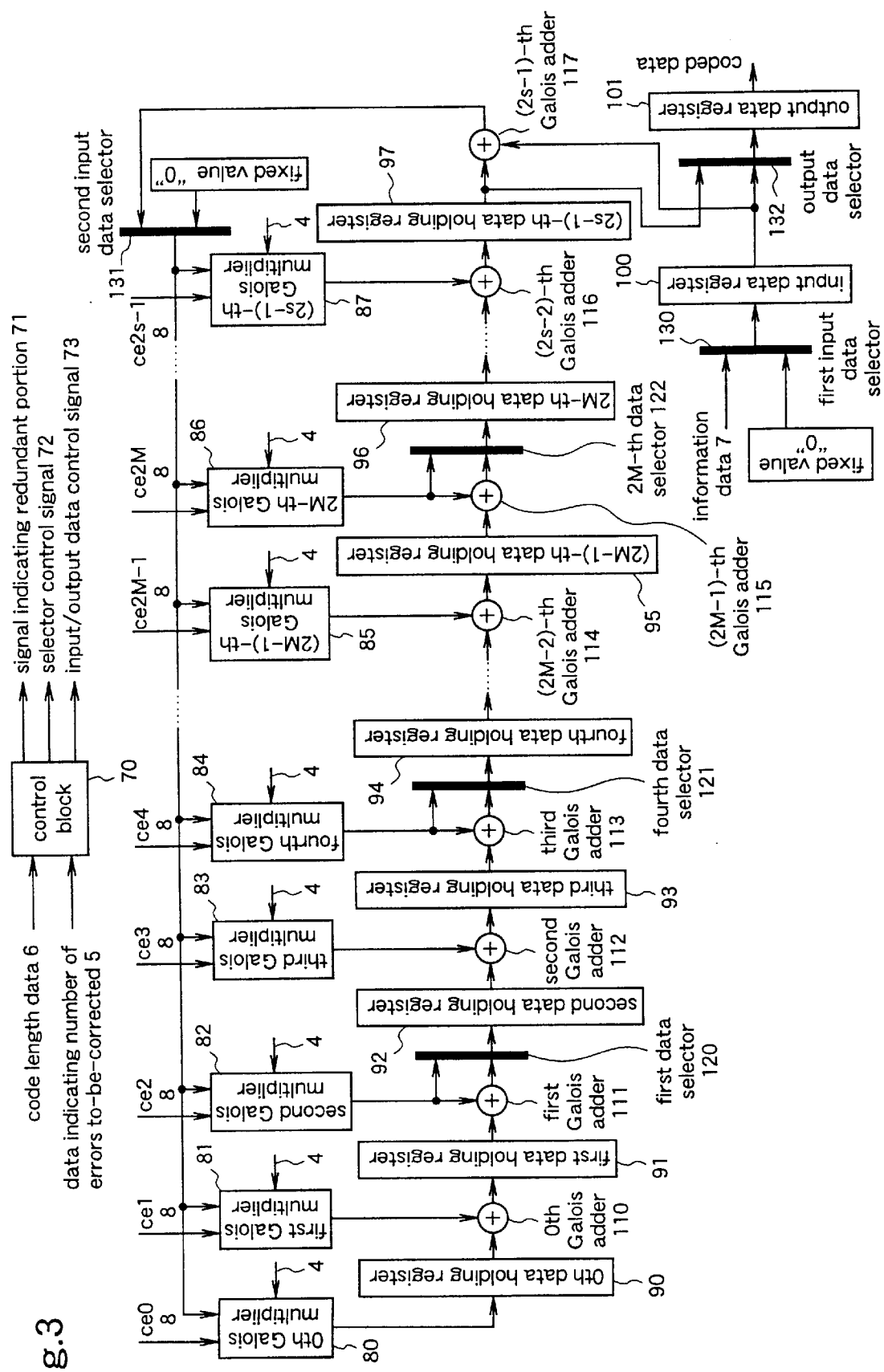
FIG. 3 is a diagram showing a structure of a data coding block included in the Reed Solomon coding apparatus of the embodiment.

FIG. 3 is a circuit diagram showing a structure of the data coding block 2, which comprises a control block 70 for controlling calculation of coefficients, 2s Galois multipliers 80–87 (0th, first, second, . . . (2M−1)-th, 2M-th, and (2s−1)-th ($3 \leq M \leq s-1$ M: integer s: maximum number of errors to-be-corrected), 2s Galois adders 110–117 (0th, first, second, . . . , (2M−1)-th, 2M-th, and (2s−1)-th ($3 \leq M \leq s-1$ M: integer), data holding registers 90–97 as 2s shift registers (0th, first, second, . . . , (2M−1)-th, 2M-th, and (2s−1)-th) ($3 \leq M \leq s-1$), (s−1) data selectors 120–122 (second, fourth, 2M-th ($3 \leq M \leq s-1$), first and second input data selectors 130 and 131, an input data register 100, an output data selector 132, and an output data register 101.

Since a redundant byte length varies depending upon the number "t" of errors to-be-corrected, the control block 70 receives the data 5 as an input, checks the data 5, and outputs a selector control signal 72 for controlling the respective data selectors. In addition, since a structure of redundant data to be coded varies depending upon a code length n of information data and the number t, the control block 70 outputs a signal 71 indicating a starting position of a redundant portion, to the second input data selector 131, and outputs an input/output data control signal 73 for controlling input/output data, to a first input data selector 130 and an output data selector 132.

The 0th Galois multiplier 80 receives generator polynomial coefficient data ce0 of a 0th degree output from the 0th coefficient data holding register 42 of the generator polynomial coefficient generation block 1 and output data of the second input data selector 131 as inputs, performs Galois multiplication on these according to the Galois operation rule adapted to the primitive polynomial, and then outputs a multiplication result to the 0th data holding register 90. The first Galois multiplier 81 receives generator polynomial coefficient data ce1 of the first degree output from the first coefficient data holding register 43 of the block 1 and the output data of the second input data selector 131 as inputs, performs Galois multiplication on these according to the Galois operation rule adapted to the primitive polynomial, and then outputs a multiplication result to the 0th Galois adder 110. The second Galois multiplier 82 receives generator polynomial coefficient data ce2 of the second degree output from the second coefficient data holding register 44 of the block 1 and the output data of the second input data selector 131 as inputs, performs Galois multiplication on these according to the Galois operation rule adapted to the primitive polynomial, and then outputs a multiplication result to the first Galois adder 111. The third Galois multiplier 83 receives generator polynomial coefficient data ce3 of the third degree output from the block 1 and the output data of the second input data selector 131 as inputs, performs Galois multiplication on these according to the Galois operation rule adapted to the primitive polynomial, and then outputs a multiplication result to the second Galois adder 112. The fourth Galois multiplier 84 receives generator polynomial coefficient data ce4 of the fourth degree output from the generation block 1 and the output data of the second input data selector 131 as inputs, performs Galois multiplication on these according to the Galois operation rule adapted to the primitive polynomial, and then outputs a multiplication result to the third Galois adder 113. The (2M−1)-th Galois multiplier 85 receives generator polynomial coefficient data ce2M−1 of the (2M−1)-th degree output from the generation block 1 and the output data of the second input data selector 131 as inputs, performs Galois multiplication on these according to the Galois operation rule adapted to the primitive polynomial, and then outputs a multiplication result to the (2M−1)-th Galois adder 114. The 2M-th Galois multiplier 86 receives generator polynomial coefficient data ce2M of the 2M-th degree output from the generation block 1 and the output data of the second input data selector 131 as inputs, performs Galois multiplication on these according to the Galois operation rule adapted to the primitive polynomial, and then outputs a multiplication result to the (2M−1)-th Galois adder 115. The (2s−1)-th Galois multiplier 87 receives generator polynomial coefficient data ce2s−1 of the (2s−1)-th degree output from the (2s−1)-th coefficient data holding register 46 of the block 1 and the output data of the second input data selector 131 as inputs, performs Galois multiplication on these according to the Galois operation rule adapted to the primitive polynomial, and then outputs a multiplication result to the (2s−2)-th Galois adder 116.

The 0th Galois adder 110 receives output data of the first Galois multiplier 81 and output data of the 0th data holding register 90, performs Galois addition on these, and outputs an addition result to the first data holding register 91. The first Galois adder 111 receives output data of the second Galois multiplier 82 and output data of the first data holding register 91, performs Galois addition on these, and outputs an addition result to the first data selector 120. The second Galois adder 112 receives output data of the third Galois multiplier 83 and output data of the second data holding register 92, performs Galois addition on these, and outputs an addition result to the third data holding register 93 The third Galois adder 113 receives output data of the fourth Galois multiplier 84 and output data of the third data holding register 93, performs Galois addition on these, and outputs an addition result to the fourth data selector 121. The (2M−2)-th Galois adder 114 receives output data of the (2M−1)-th Galois multiplier 85 and output data of the (2M−2)-th data holding register, performs Galois addition on these, and outputs an addition result to the (2M−1)-th data holding selector 95. The (2M−1)-th Galois adder 115 receives output data of the 2M-th Galois multiplier 86 and output data of the (2M−1)-th data holding register 95, performs Galois addition on these, and outputs an addition result to the 2M-th data selector 122. The (2s−2)-th Galois adder 116 receives output data of the (2s−1)-th Galois multiplier 87 and output data of the (2s−2)-th data holding register, performs Galois addition on these, and outputs an addition result to the (2s−1)-th data holding register 97. The (2s−1)-th Galois adder 117 receives output data of the (2s−1)-th data holding register 97 and output data of the input data register 100, performs Galois addition on these, and outputs an addition result to the second input data selector 131.

The 0th data holding register 90 receives and holds output data of the 0th Galois multiplier 80, and then outputs this data to the 0th Galois adder 110. The first data holding register 91 receives and holds the output of the 0th Galois adder 110 and outputs this data to the first Galois adder 111. The second data holding register 92 receives and holds output data of the first data selector 120, and then outputs this data to second Galois adder 112. The third data holding register 93 receives and holds the output of the second Galois adder 112, and then outputs this data to the third Galois adder 113. The fourth data holding register 94 receives and holds output data of the fourth data selector 121, and then outputs this data to a fourth Galois adder. The (2M−1)-th data holding register 95 receives and holds the output of the (2M−2)-th Galois adder 114, and then outputs this data to the (2M−1)-th Galois adder 115. The 2M-th data holding register 96 receives and holds output data of the 2M-th data selector 122, and outputs this data to a 2M-th Galois adder. The (2s−1)-th data holding register 97 receives and holds the output of the (2s−2)-th Galois adder 116, and then outputs this data to the (2s−1)-th Galois adder 117 and the output data selector 132.

The first input data selector 130 selects either input information data 7 or a fixed value "0", and outputs the selected data to the input data register 100. The second input data selector 131 selects either output data of the (2s−1)-th Galois adder 117 or the fixed value "0", and outputs the selected data to the 0th to (2s−1)-th Galois multipliers 80–87.

The input data register 100 receives and holds the output data of the first input data selector 130, and then outputs this data to the (2s−1)-th Galois adder 117 and the output data selector 132.

The output data selector 132 selects either output data of the (2s−1)-th data holding register 97 or output data of the input data register 100, and outputs the selected data to the output data register 101, which receives and holds the data, and then outputs Reed-Solomon coded data.

A data coding circuit of cyclic codes such as Reed Solomon codes has been conventionally known. One general example of this is a circuit in which a data input position in a division circuit for a polynomial is shifted by 2t stages. The structure and operation of this circuit is disclosed in "Error Correcting Codes and Its Application" (Television Institute Edition pp180–181) or in "Code theory" (Institute of Electronics, Information and Communication Engineers pp113–118). The data coding block of the present invention is basically constructed of an input-shift polynomial division circuit but differs in the conventional circuit in that the number of errors to-be corrected and the primitive polynomial are variable.

Operation of the data coding block 2 of the embodiment will now be described. Here it is assumed that the maximum number of errors to-be-corrected s=10. Initially, the generator polynomial coefficient data 8, i.e., coefficient data ce0–ce19 output from the data block 1 are sequentially input to the 0th to 19th Galois multipliers 80–87, respectively, in increasing order of the degree. The generator polynomial coefficient data 8, i.e., the 20 coefficient data ce0–ce19 are held until the data coding process is completed.

Meanwhile, 235 information data 7 as coefficients of the information polynomial to-be-divided, are sequentially input in decreasing order of the degree, and sent through the first input data selector 130 to the input data register 100, to be held therein, and then output to the 19th Galois adder 117 and the output data selector 132.

The output data selector 132 always selects the output of the input data register 100 while the information data 7 is input, passes the information data 7, to the output data register 101. The output data register 101 temporarily holds this data and outputs coded data.

The information data 7 input to the 19th Galois adder 117 from the input data register 100 are added to the output value of the 19th data holding register 97 and input to the second input data selector 131. Since the first to 19th data holding registers 90–97 are reset in such a way that they have an initial value "0", first 20 input information data 7 passes through the 19th Galois adder 117.

The second input data selector 131 selects the output of the 19th Galois adder 117 while 235 information data 7 are input, although it selects the fixed value "0" as the following 20, i.e., 2s data.

The information data 7 are sent through the second input data selector 131 to the 0th to 19th Galois multipliers 80–87, which performs Galois multiplication on the information data 7 and the generation polynomial coefficient data 8. In this case, like the block 1, the 0th to 19th Galois multipliers 80–87 respectively receive the primitive polynomial set value 4 and perform Galois multiplication according to the Galois operation rule adapted to the primitive polynomial. The output data of the 0th Galois multiplier 80 is sent to the 0th data holding register 90 and held therein. The output data of the first to 19th Galois multipliers 81–87 are input to the 0th to 18th Galois adder 110–116. Note that even-numbered Galois multipliers 82, 84, and 86 (second, fourth, ... 2M-th $9 \geq M \geq 3$) also output data to the first data selector 120, the fourth data selector 121, ... the 2M-th data selector 122 simultaneously. To the other inputs of the 0th to 19th Galois adder 110–117, data of the 0th to 19th data holding register 90–97 are input, respectively.

The 0th and first data holding registers 90 and 91 receive output data of the 0th and first Galois multipliers 80 and 81 as inputs, respectively. The second data holding register 92 receives the data selected by the first data selector 120. The selector 120 selects either the output data of the second Galois multiplier 82 or the output data of the first Galois adder 111. When the "t" is 10, the selector 120 always selects the output data of the first Galois adder 111, whereas when the "t" is smaller than the s=10, that is, the "t" is 9 or less, the selector 120 always selects the output data of the second Galois multiplier 82, and blocks calculation results of the 0th and first registers 90 and 91, thereby reducing stages of the shift registers.

The third data holding register 93 receives the output data of the second Galois adder 112 as an input and the fourth data holding register 94 receives the data selected by the fourth data selector 121 as an input. The selector 121 selects either the output data of the fourth Galois multiplier 84 or the output data of the third Galois adder 113. When the "t" is 9 or more, the selector 121 always selects the output data of the third Galois adder 113, whereas, the "t" is 8 or less, the selector 121 selects the output data of the fourth Galois multiplier 84, and blocks calculation results of the first to third data holding registers 91–93, thereby reducing stages of the shift registers.

Likewise, an odd-numbered, (2M−1)-th ($9 \geq M \geq 3$) register 95 receives the output data of the (2M−2)-th Galois adder as an input, and an even-numbered, 2M-th register 96 receives the output data of the 2M-th data selector 122 as an input. The 2M-th data selector 122 selects either the output data of the 2M-th Galois multiplier 86 or the output data of the (2M−1)-th Galois adder 115.

Control of selection by the 2M-th data selector 122, as described above, depends upon the data 5. When the number "t" is 7, the sixth data selector selects the output of the sixth Galois multiplier, while when the "t" is 6, the 8-th data selector selects the output of the 8-th Galois multiplier. Likewise, when the number "t" is 5, 4, ... 1, the 10th, 12th, ..., 18th data selectors select the outputs of the 10th, 12th, and 18th Galois multipliers, respectively, thereby reducing stages of the shift registers.

In brief, in this data coding block 2, for the number "t" of errors to-be-corrected which is equal to the maximum value "s"=10 or less ($s \geq t \geq 1$), a 2(s−t)-th selector is adapted to select an output of a 2(s−t)-th multiplier.

So constructed, when the number "t" of errors to-be-corrected is 10, and all of the 0th to 19th data holding registers 90–97 are used to perform calculation until all of the 235 information data 7 are input, the data held in the 0th to 19th data holding registers 90–97 become redundant data. In order to output this redundant data, the output data selector 132 selects the output data of the 19th data holding register 97, and the output data register 101 temporarily holds this data, which is then added to the information data 7, and the resulting Reed-Solomon coded data is output.

The selector control signal 72 is controlled by the data 5, the input/output data control signal 73 and the signal 71 are controlled by the code length data 6 and the data 5. The 235 information data 7 and 20 redundant data are recognized and controlled.

Thus, the information data 7 is divided by the coefficient data and the 2(s−t)-th selector selects the output of the 2(s−t)-th multiplier with respect to the number "t" of errors to-be-corrected. Thereby, the stages of the shift registers comprising the 0th to 19th data holding registers can be changed according to the number "t". As a result, when the umber "t" is changed, the Reed-Solomon coding process is carried out according to the change of the number "t".

Figure 4:
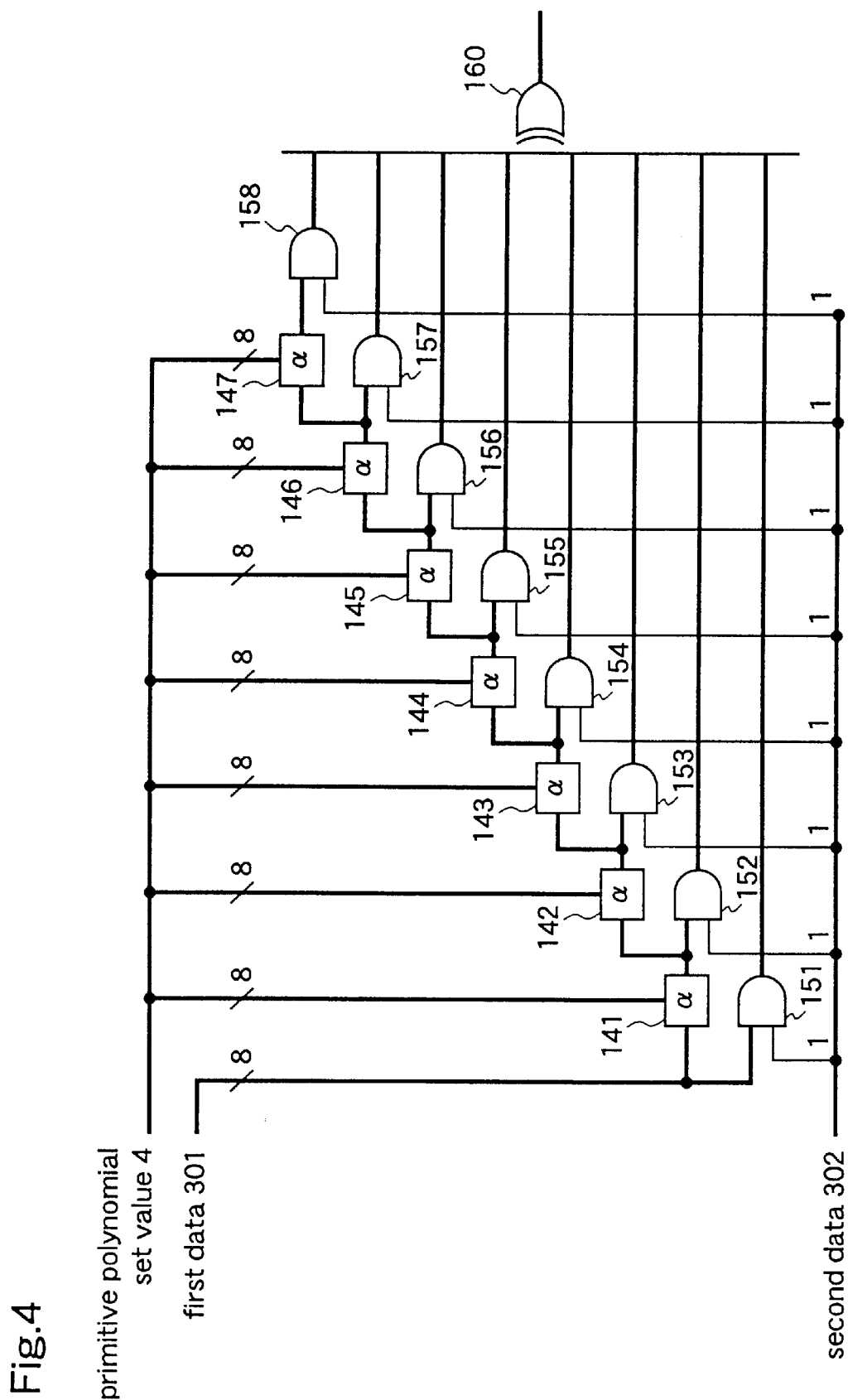
FIG. 4 is a diagram showing a structure of a Galois multiplier of the Reed Solomon coding apparatus of the embodiment.

FIG. 4 is a circuit diagram showing a structure of each of the Galois multipliers 20–25 and the Galois multipliers 80–87 shown FIGS. 2 and 3. The circuit is adapted to receive first and second n-bit input data 301 and 302 and perform Galois operation on these two data. The circuit comprises (n−1 n: integer) coefficient units 141–147 (first to (n−1)-th) serially connected, each of which multiplies data by α according to the Galois operation rule adapted to the primitive polynomial, n AND gates 151–158 (first to n-th) which output ANDs of n-bit data and 1-bit data, and an exclusive-OR (XOR) gate 160 which has n inputs of n bits and outputs an XOR. In this example shown in FIG. 3, n=8 is adopted. When the "n" changes, the number of coefficient units and the number of the AND qates are increased/decreased with an increase/decrease in the "n".

The first coefficient unit 141 receive the first n-bit input data 301 input to the Galois multiplier, and an n-bit value determined according to the primitive polynomial, i.e., the primitive polynomial set value 4, multiplies the n-bit input data 301 by a according to the Galois operation rule adapted to the value, and outputs a multiplication result to the second coefficient unit 142 and the second AND gate 152. Likewise, the K-th (n−2≧k≧2 K : integer) coefficient units 142–146 receive the n-bit data output from the (K−1)-th coefficient units, respectively, and the n-bit primitive polynomial get value 4, respectively multiply the n-bit input data by α according to the Galois operation rule adapted to the value, and output multiplication results to the (K+1)-th coefficient units and (K+1)-th AND gates, respectively. The (n−1)-th coefficient unit 147 receives the n-bit data output from the (n−2)-th coefficient unit 146 and the primitive polynomial set value 4 (n bits), multiplies the n-bit input data by a according to the Galois operation rule adapted to the value, and outputs a multiplication result to the n-th AND gate 158.

The first AND gate 151 receives the first n-bit input data 301 input to the Galois multiplier, and the least significant bit of the second n-bit input data 302 input to the Galois adder, and outputs the AND of the first input data 301 and n-bit data obtained by extending the least significant bit of the second input data into n bits, to the XOR gate 160. The second AND gate 152 receives the output of the first coefficient unit 141 and a second bit seen from the least significant bit of the second n-bit data B, and outputs the AND of these to the XOR gate 160. The (K+1)-th AND gates 152–158 each outputs the AND of the n-bit data output from each of the K-th coefficient units and n-bit data obtained by extending the K-th bit of the second n-bit input data 302 input to the Galois multiplier into n bits, to the XOR gate 160. It should be remembered that the K-th bit of the second input data 302 refers to a bit numbered from the least significant bit assuming that the least significant bit is a 0th bit and the most significant bit is an(n−1)-th bit. The n-th AND gate 158 outputs the AND of n-bit data output from the (n−1)-th coefficient unit 147 and n-bit data obtained by extending an (n−1)-th bit of the second input data 302 into n bits, to the XOR gate 160.

The XOR gate 160 outputs the XOR data of n n-bit data output from the nAND gates 151–158 (first to n-th), as output data of the Galois multiplier.

Figure 5:
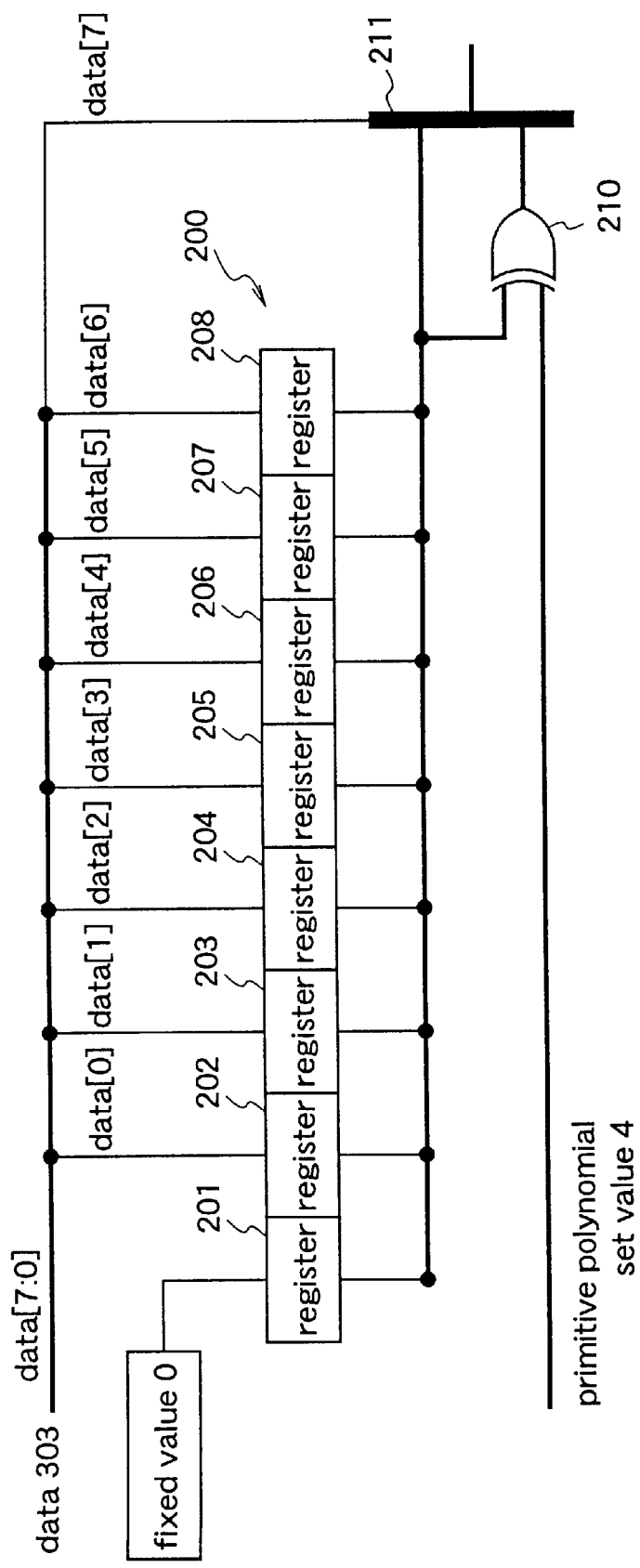
FIG. 5 is a diagram showing a structure of a coefficient unit included in the Reed Solomon coding apparatus of the embodiment.
Figure 6:
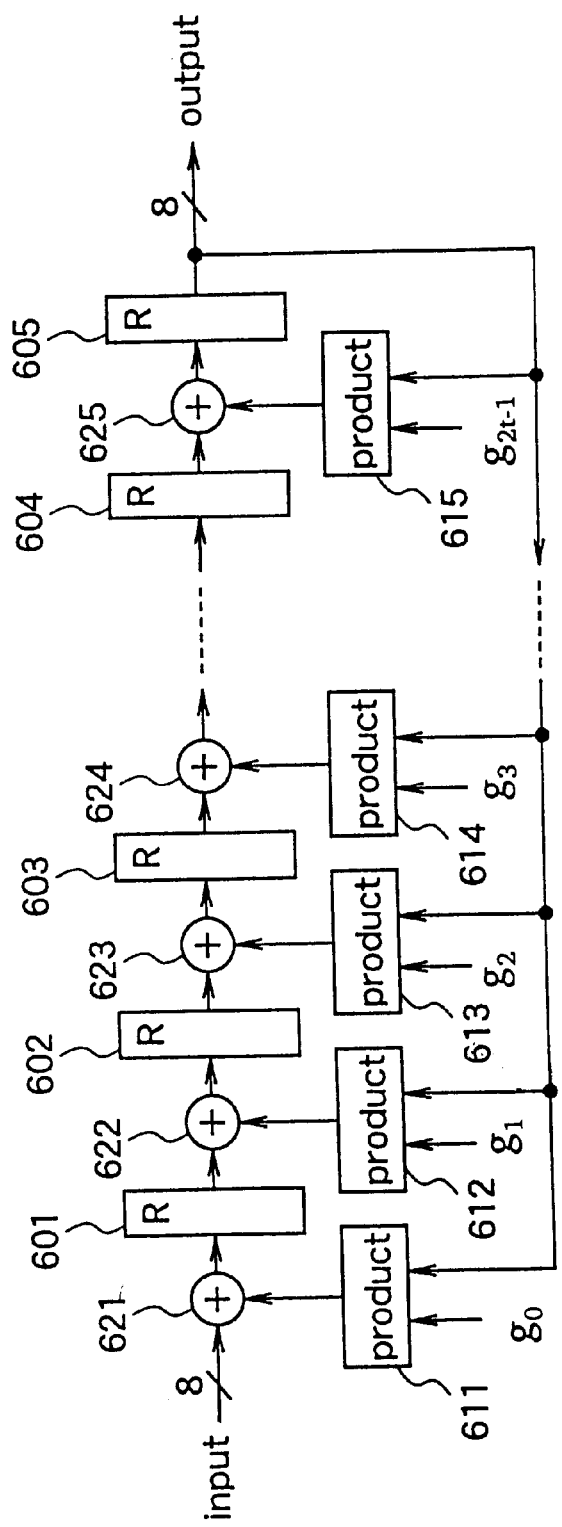
FIG. 6 is a diagram showing a structure of an error correcting circuit of a conventional Reed Solomon coding apparatus.

FIG. 5 is a circuit diagram showing structures of the coefficient units 141–147 which carry out multiplication by α shown in FIG. 4. Each of the coefficient units 141–147 comprises n-bit registers 200 comprising first to n-th registers 201–208, an n-bit two-input exclusive-OR gate 210, and an output data selector 211, and is adapted to receive the n-bit input data 303 and the primitive polynomial set value 4 adapted to the primitive polynomial as inputs and multiply the n-bit input data 303 by a according to the Galois operation rule adapted to the value 4. Data [n-1 :0] represents n-bit data having the 0th to (n−1)-th bits. Data [0] represents the least significant bit of the n-bit input data 303, and a lager value in [ ] represents upper-bit data. In this illustrated example, n=8. When the n is not 8, the number of registers is increased/decreased with an increase/decrease in the n.

The first register 201 receives the fixed value "0", holds the bit data, and then outputs this data. Q-th (n≧Q≧2 Q: integer) registers 202–208 each receive (Q-2)-th bit data of the n-bit input data as inputs, holds and then outputs the bit data. The XOR gate 210 XORs the set value 4 and the n-bit data output from the n registers 201–208, and outputs the XOR of n bits. The output selector 211 selects either the n-bit data output from the first to n-th registers 201–208 or the output of the XOR gate 210, according to a selection signal corresponding to the most significant bit data of the n-bit input data 303 input to the coefficient unit.

A description will be given of structures and operation of the Galois multipliers and the coefficient units (multipliers) according to the embodiment The primitive polynomial is:

$$P(x)=x^8+x^4+x^3+x^2+1$$

Therefore, the input/output data respectively has 8-bit width.

The Galois multiplier shown in FIG. 4 is constituted by the coefficient units 141–147 which carry out multiplication by α. A description will be given of the structures and operation of the coefficient units with reference to FIG. 5.

Consider elements on the Galois filed in case of $P(x)=x^8+x^4+x^3+x^2+1$. As mentioned previously, when $P(\alpha)=0$, $\alpha^8=\alpha^4+\alpha^3+\alpha^2+1$, therefore, $\alpha^9=\alpha^6+\alpha^4+\alpha^3+\alpha$ $\alpha^{10}=\alpha^6+\alpha^5+\alpha^4+\alpha^2$ $\alpha^{11}=\alpha^7+\alpha^6+\alpha^5+\alpha^3$ $\alpha^{12}=\alpha^8+\alpha^7+\alpha^6+\alpha^4=(\alpha^4+\alpha^3+\alpha^2+1)+\alpha^7=\alpha^6+\alpha^4=\alpha^7+\alpha^6+\alpha^3+\alpha^2+1,$ .
. . .

$\alpha^9$ is always replaced and elements of $\alpha^7$ or lower are used.

This is expressed as vectors as follows:

$\alpha^0$=00000001, $\alpha^1$=00000010, $\alpha^7$=10000000, $\alpha^8$=00011101,
$\alpha^9$=00111010, $\alpha^{10}$=01110100, $\alpha^{11}$=11101000, $\alpha^{12}$=11001101, .
. . .

This bit operation for multiplication by α is basically performed by left-shifting. In case of $\alpha^8$, $\alpha^8$, is replaced by $(\alpha^4+\alpha^3+\alpha^2+1)$. As a vector value, "00011101", i.e., "1d" in hexadecimal notation is subjected to Galois addition. The vector value "1d" corresponding to the $\alpha^8$ is created in advance, and is input the coefficient unit as the set value 4. When $\alpha^8$ appears as a result of multiplication of a specified element by α, the element includes $\alpha^7$, and therefore, "1" is present as the most significant bit, expressed in terms of a vector value.

The coefficient unit is provided with the 8-bit shift registers 200 as shown in FIG. 5. A left-shifted value is found as follows. The fixed value "0" is input into the least significant bit register 201, and 8-bit data 303 is input to the coefficient unit. In this case, 0th to 6th bit data of the data 303 are input to upper 7-bit registers 202–208. When the most significant bit of the input data 303 is "1", the $\alpha^0$ will appear next. So, a Galois addition value of the values held in the 8-bit registers 200 and the set value 4, i.e., the XOR is selected and output. When the most significant bit is "0", the values left-shifted and held in the registers are directly output.

The $\alpha^8$ for determining the Galois operation, i.e., the primitive polynomial set value 4 varies depending upon the primitive polynomial. Therefore, in this embodiment, when different primitive polynomials are used, set values 4 adapted to the respective primitive polynomials are prefound, and input, whereby bit operation (multiplication by $\alpha$) adaptive to the different primitive polynomials can be carried out.

In case of the 8-bit data, the primitive polynomial set value 4 is $\alpha^8$. In case of n-bit data, that is, when a degree of an extended field is m (m≧1 m: integer), $\alpha^m$ (m: power), i.e., one of primitive elements $\alpha$ is used.

A description will be given of operation of the Galois multiplier shown in FIG. 4. Let's discuss Galois operation (8 bits×8 bits)

Consider A, B, and C as elements of the Galois field, and suppose that C=A×B.

When a vector value of B is B=B$_7$ B$_6$ B$_5$ B$_4$ B$_3$ B$_2$ B$_1$ B$_0$ ("0" or "1" bit pattern), $$B=B_7\alpha^7+B_6\alpha^6+B_5\alpha^5+B_4\alpha^4+B_3\alpha^3+B_2\alpha^2+B_1\alpha+B_0$$

In Galois operation, a distributive law and a commutative law are established, and therefore, $$C=A\times B=A\times(B_7\alpha^7+B_6\alpha^6+B_5\alpha^5+B_4\alpha^4+B$$
$$3\alpha^3+B_2\alpha^2+B_1\alpha B_0)=A\alpha^7B_7+A\alpha^6B_6+A\alpha^5$$
$$B_5+A\alpha^4B_4+A\alpha^3B_3+A\alpha^2B_2+A\alpha B_1+AB_0)$$

This calculation is implemented by the Galois multipliers shown in FIG. 4. In the example shown in FIG. 4, the data 301 corresponds to A and the data 301 corresponds to B. The data obtained by multiplying the data 301 by ($\alpha^7, \alpha^6, \ldots \alpha$), and bit data (B$_7$–B$_0$) of the data 302 are ANDed, and the resulting respective multiplication data are added, that is, XORed, and output as multiplication data. The coefficient units which implement multiplication by ($\alpha^7, \alpha^6, \ldots \alpha$) are implemented by serially connecting the coefficient units shown in FIG. 5 in 7 stages and using the output data of the respective coefficient units.

This Galois multiplier uses the coefficient units which are capable of multiplication by $\alpha$ for different primitive polynomials, whereby Galois operation is carried out according to respective primitive polynomials. In accordance with the embodiment, the generator polynomial coefficient generation block 1 which expands the generator polynomial by the use of the primitive polynomial set value 4 to obtain the coefficient data 8, and the data coding block 2 which divides the information polynomial by the generator polynomial by the use of the primitive polynomial set value 4 are provided, whereby the Reed-Solomon coding process can be adaptively carried out for any primitive polynomial.

Thus, the Red-Solomon coding apparatus and the Reed-Solomon coding method of this embodiment are capable of performing the Reed-Solomon coding process in which parameters such as the primitive polynomial set value; the generator initial value, and the number of errors to-be-corrected are variable, and are perfectly adapted to any primitive polynomial and any generator polynomial.

While in this embodiment, the maximum number s of errors to-be-corrected is 10 and the degree of the Galois field is 8, that is, the number of bits of the Galois multiplier and the like is 8, the present invention provides the same effectiveness if these values are increased/decreased.

In addition, in accordance with the present invention, the Red-Solomon coding apparatus of this embodiment may be realized by a programmed computer in such a way that it comprises the same means as the apparatus of this embodiment.

Further, while in this embodiment, the data coding block 2 is capable of performing the coding process according to the number t of errors to-be-corrected ranging from 1 to s (maximum number), the number t may have a fixed value. For instance, the data coding block may be constructed as shown in FIG. 7. The data coding block comprises a 0th Galois multiplier 80a which performs multiplication on a 0th value ce0 of the coefficient data 8 of the generator polynomial and the information data 7, a 0th data holding register 90a for holding the output of the 0th multiplier 80a, an R-th Galois multiplier 86a which performs multiplication on an R-th (2t−2≧R≧1 R: integer) value ceR of the coefficient data 8 and the information data 7, a (R−1)-th Galois adder 115a which performs addition on the output of the R-th Galois multiplier 86a and data held in an (R−1)-th data holding register 95a, an R-th data holding register 96a which holds the output of the (R−1)-th Galois adder 115a, a (2t−1)-th Galois multiplier 87a which performs multiplication on a value ce2t−1 of a (2t−1)-th degree of the coefficient data 8 and the information data 7, a (2t−2)-th Galois adder 116a which performs addition on the output of the (2t−1)-th Galois multiplier 87a and data held in a (2t−2)-th register, and a (2t−1)-th Galois adder 117a which performs addition on the output of a (2t−1)-th data holding register 97a and the information data 7. Also in this case, the Reed-Solomon coding is carried out if the generator polynomial or the primitive polynomial is changed.

Moreover, while in this embodiment, the generator initial value, the primitive polynomial set value, and the number of errors to-be-corrected are all changed, the present invention is applicable to a case where only one of these is changed.

What is claimed is:

1. A Reed Solomon coding apparatus comprising:
   a generator polynomial coefficient generation means which receives a generator initial value corresponding to a primitive element with a minimum power of roots corresponding to powers of $\alpha$ which are obtained by setting a generator polynomial to be zero, as inputs, wherein a number of errors to be corrected is t, t is an integer at least equal to 1, and said generator polynomial coefficient generation means comprises;
   a 2t-th multiplier which repeats multiplication by the primitive element $\alpha$ with respect to the generator initial value, and outputs a multiplication result for each multiplication;
   a 0th multiplier which performs multiplication on the generator initial value and the multiplication result of said 2t-th multiplier, and then repeats multiplication on the resulting multiplication result and the multiplication result of said 2t-th multiplier;
   a 0th register which updates and holds output data of said 0-th multiplier;
   a first adder which receives output data of said 0-th register on one input and performs addition on two inputs;
   a first register which updates and holds output data of said first adder;
   a first multiplier which performs multiplication on output data of said first register and output data of said 2t-th multiplier, and outputs a multiplication result to the other input of said first adder;
   an N-th adder which receives output data of an (N−1)-th register, wherein 2t−1≧N≧2 and N is an integer, on one input, and performs addition on two inputs;
   an N-th register which updates and holds output data of said N-th adder; and
   an N-th multiplier which performs multiplication on output data of said N-th register and output data of said 2t-th multiplier, and outputs a multiplication result to the other input of said N-th adder;

wherein data held in said 0-th to (2t−1)-th registers are output as coefficient data of the generator polynomial; and a data coding means which receives information data and the coefficient data as inputs, divides the information data by the coefficient data according to a change of either the generator initial value or the primitive polynomial set value to obtain remainder data, and couples the remainder data and the information data to form Reed-Solomon coded data.

2. A Reed Solomon coding apparatus as claimed in claim 1, wherein said multipliers each receives a primitive polynomial set value corresponding to a value of an $\alpha^m$, wherein a degree of a Galois field is m, m is an integer at least equal to 1, and one of primitive element is $\alpha$, as inputs, and comprises coefficient units serially connected in (m−1) stages, said coefficient units each performing multiplication on the primitive element $\alpha$ by using a combination of a bit-shifted primitive element $\alpha$ and an exclusive-OR of the bit-shifted primitive element $\alpha$ and the primitive polynomial set value $\alpha^m$.

3. A Reed Solomon coding apparatus as claimed in claim 2, wherein said coefficient units each outputs a vector value obtained by shifting a vector value of the generator initial value by one bit to the left every time it performs multiplication on the primitive element $\alpha$, and when the most significant bit is 1, said coefficient unit outputs an exclusive-OR of the bit-shifted primitive element $\alpha$ and the primitive polynomial set value $\alpha^m$ when a corresponding degree increases.

4. A Reed Solomon coding apparatus as claimed in claim 1, wherein said data coding means comprises:

a 0th coding multiplier which performs multiplication on a value of a 0th degree of the coefficient data of the generator polynomial and the information data;

a 0th coding register which holds output data of said 0th coding multiplier;

an R-th multiplier which performs multiplication on a value of an R-th degree, wherein 2t−2≧R≧1, of the coefficient data of the generator polynomial and the information data;

an (R−1)-th adder which performs addition on output data of said R-th multiplier and data held in an (R−1)-th register;

an R-th register which holds output data of said (R−1)-th adder;

a (2t−1)-th multiplier which performs multiplication on a value of a (2t−1)-th degree of the coefficient data of the generator polynomial and the information data;

a (2t−2)-th adder which performs addition on output data of said (2t−1)-th multiplier and data held in a (2t−2)-th register;

a (2t−1)-th register which holds on output data of said (2t−2)-th adder; and a (2t−1)-th adder which performs addition on output data of said (2t−1)-th register and the information data.

5. A Reed Solomon coding apparatus as claimed in claim 4, wherein said multipliers each comprises:

a plurality of serially connected coefficient units, said coefficient units each multiplying input data by the primitive element $\alpha$;

a plurality of gate circuits, said gate circuits each ANDing bit data of input data and output data of each of said coefficient units; and a gate circuit for exclusive-ORing respective output data of said plurality of gate circuits.

6. A Reed Solomon coding apparatus as claimed in claim 5, wherein each of said coefficient units comprises:

a plurality of registers which shift bits other than the most significant bit of the input data to be multiplied and hold bit-shifted data, and add zero as the lowest data to the bit-shifted data and output addition data; and a selector which receives the most significant bit of the input data as an input, and selects and outputs an exclusive-OR of the primitive polynomial set value corresponding to a value of an $\alpha^m$ wherein a degree of a Galois field is m, m is an integer at least equal to 1, and one of primitive element is $\alpha$, outputs data of the registers when the most significant bit is 1, and selects and outputs the output data of the registers when the most significant bit is zero.

7. A Reed Solomon coding apparatus as claimed in claim 1, wherein said multipliers each comprises:

a plurality of serially connected coefficient units, said coefficient units each multiplying input data by the primitive element $\alpha$;

a plurality of gate circuits, said gate circuits each ANDing bit data of input data and output data of each of said coefficient units; and a gate circuit for exclusive-ORing respective output data of said plurality of gate circuits.

8. A Reed Solomon coding apparatus as claimed in claim 7, wherein each of said coefficient units comprises:

a plurality of registers which shift bits other than the most significant bit of the input data to be multiplied and hold bit-shifted data, and add zero as the lowest data to the bit-shifted data and output addition data; and a selector which receives the most significant bit of the input data as an input, and selects and outputs an exclusive-OR of the primitive polynomial set value corresponding to a value of an $\alpha^m$ wherein a degree of a Galois field is m, m is an integer at least equal to 1, and one of primitive element is $\alpha$, outputs data of the registers when the most significant bit is 1, and selects and outputs the output data of the registers when the most significant bit is zero.

9. A Reed Solomon coding apparatus comprising:

a generator polynomial coefficient generation means which receives a generator initial value corresponding to a primitive element with a minimum power of roots corresponding to powers of a which are obtained by setting a generator polynomial to be zero, and a number t of errors to be corrected, t being an integer at least equal to 1, and expands the generator polynomial according to a change of the generator initial value and the number t, to generate coefficient data comprising coefficients of respective degrees; and a data coding means which receives information data and the coefficient data as inputs, wherein a maximum number of errors to be corrected is s, s being an integer at least equal to t, and said data coding means comprises:

a 0th multiplier which performs multiplication on a value of a 0th degree of the coefficient data of the generator polynomial and the information data;

a 0th register which holds output data of said 0th multiplier;

a (2M−1)-th multiplier which performs multiplication on a value of a (2M−1)-th of the coefficient data of the generator polynomial and the information data, wherein s−1≧M≧1 and M is an integer;

a 2M-th multiplier which performs multiplication on a value of a 2M-th degree of the coefficient data of the generator polynomial and the information data;

a (2M−1)-th adder which performs addition on output data of said 2M-th multiplier and data held in a (2M−1)-th register;

a 2M-th selector which selects one of output data of said (2M−1)-th adder and output data of said 2M-th multiplier;

a 2M-th register which holds output data of said 2M-th selector;

a (2s−1)-th multiplier which performs multiplication on a value of a (2s−1)-th degree of the coefficient data of the generator polynomial and the information data;

a (2s−2)-th adder which performs addition on output data of said (2s−1)-th multiplier and data held in a (2s−2)-th register; and a (2s−1)-th register which holds output data of said (2s−2)-th adder;

wherein a (2(s−t))-th selector selects output data of a (2(s−t))-th multiplier, with respect to the number t of errors to be corrected, and the output and the information data are coupled to form Reed-Solomon coded data.

10. A Reed Solomon coding apparatus as claimed in claim 9, wherein said multipliers each receives a primitive polynomial set value corresponding to a value of an $\alpha^m$, wherein a degree of a Galois field is m, m is an integer at least equal to 1, and one of primitive element is $\alpha$, as inputs, and comprises coefficient units serially connected in (m−1) stages, said coefficient units each performing multiplication on the primitive element $\alpha$ by using a combination of a bit-shifted primitive element $\alpha$ and an exclusive-OR of the bit-shifted primitive element $\alpha$ and the primitive polynomial set value $\alpha^m$.

11. A Reed Solomon coding apparatus as claimed in claim 10, wherein said coefficient units each outputs a vector value obtained by shifting a vector value of the generator initial value by one bit to the left every time it performs multiplication on the primitive element $\alpha$, and when the most significant bit is 1, said coefficient unit outputs an exclusive-OR of the bit-shifted primitive element $\alpha$ and the primitive polynomial set value $\alpha^m$ when a corresponding degree increases.

12. A Reed Solomon coding apparatus comprising:

a generator polynomial coefficient generation device operable to receive a generator initial value corresponding to a primitive element with a minimum power of roots corresponding to powers of $\alpha$ which are obtained by setting a generator polynomial to be zero, as inputs, wherein a number of errors to be corrected is t, t is an integer at least equal to 1, and said generator polynomial coefficient generation device comprises;

a 2t-th multiplier operable to repeat multiplication by the primitive element $\alpha$ with respect to the generator initial value, and output a multiplication result for each multiplication;

a 0th multiplier operable to perform multiplication on the generator initial value and the multiplication result of said 2t-th multiplier, and then repeat multiplication on the resulting multiplication result and the multiplication result of said 2t-th multiplier;

a 0th register operable to update and hold output data of said 0-th multiplier;

a first adder operable to receive output data of said 0-th register on one input and perform addition on two inputs;

a first register operable to update and hold output data of said first adder;

a first multiplier operable to perform multiplication on output data of said first register and output data of said 2t-th multiplier, and output a multiplication result to the other input of said first adder;

an N-th adder operable to receive output data of an (N−1)-th register, wherein 2t−1≧N≧2 and N is an integer, on one input, and perform addition on two inputs;

an N-th register operable to update and hold output data of said N-th adder; and an N-th multiplier operable to perform multiplication on output data of said N-th register and output data of said 2t-th multiplier, and output a multiplication result to the other input of said N-th adder;

wherein data held in said 0-th to (2t−1)-th registers are output as coefficient data of the generator polynomial; and a data coding device operable to receive information data and the coefficient data as inputs, divide the information data by the coefficient data according to a change of either the generator initial value or the primitive polynomial set value to obtain remainder data, and couple the remainder data and the information data to form Reed-Solomon coded data.

13. A Reed Solomon coding apparatus as claimed in claim 12, wherein said multipliers each are operable to receive a primitive polynomial set value corresponding to a value of an $\alpha^m$, wherein a degree of a Galois field is m, m is an integer at least equal to 1, and one of primitive element is $\alpha$, as inputs, and comprises coefficient units serially connected in (m−1) stages, said coefficient units each operable to perform multiplication on the primitive element $\alpha$ by using a combination of a bit-shifted primitive element $\alpha$ and an exclusive-OR of the bit-shifted primitive element $\alpha$ and the primitive polynomial set value $\alpha^m$.

14. A Reed Solomon coding apparatus as claimed in claim 13, wherein said coefficient units each are operable to output a vector value obtained by shifting a vector value of the generator initial value by one bit to the left every time it performs multiplication on the primitive element $\alpha$, and when the most significant bit is 1, said coefficient units is operable to output an exclusive-OR of the bit-shifted primitive element $\alpha$ and the primitive polynomial set value $\alpha^m$ when a corresponding degree increases.

15. A Reed Solomon coding apparatus as claimed in claim 12, wherein said data coding device comprises:

a 0th coding multiplier operable to perform multiplication on a value of a 0th degree of the coefficient data of the generator polynomial and the information data;

a 0th coding register operable to hold output data of said 0th coding multiplier;

an R-th multiplier operable to perform multiplication on a value of an R-th degree, wherein 2t−2≧R≧1, of the coefficient data of the generator polynomial and the information data;

an (R−1)-th adder operable to perform addition on output data of said R-th multiplier and data held in an (R−1)-th register;

an R-th register operable to hold output data of said (R−1)-th adder;

a (2t−1)-th multiplier operable to perform multiplication on a value of a (2t−1)-th degree of the coefficient data of the generator polynomial and the information data;

a (2t−2)-th adder operable to perform addition on output data of said (2t−1)-th multiplier and data held in a (2t−2)-th register;

a (2t−1)-th register operable to hold on output data of said (2t−2)-th adder; and a (2t−1)-th adder operable to perform addition on output data of said (2t−1)-th register and the information data.

16. A Reed Solomon coding apparatus as claimed in claim 15, wherein said multipliers each comprises:

a plurality of serially connected coefficient units, said coefficient units each operable to multiply input data by the primitive element $\alpha$;

a plurality of gate circuits, said gate circuits each operable to AND bit data of input data and output data of each of said coefficient units; and a gate circuit operable to exclusive-OR respective output data of said plurality of gate circuits.

17. A Reed Solomon coding apparatus as claimed in claim 16, wherein each of said coefficient units comprises:

a plurality of registers operable to shift bits other than the most significant bit of the input data to be multiplied and hold bit-shifted data, and add zero as the lowest data to the bit-shifted data and output addition data; and a selector operable to receive the most significant bit of the input data as an input, and select and output an exclusive-OR of the primitive polynomial set value corresponding to a value of an $\alpha^m$ wherein a degree of a Galois field is m, m is an integer at least equal to 1, and one of primitive element is $\alpha$, output data of the registers when the most significant bit is 1, and select and output the output data of the registers when the most significant bit is zero.

18. A Reed Solomon coding apparatus as claimed in claim 12, wherein said multipliers each comprises:

a plurality of serially connected coefficient units, said coefficient units each operable to multiply input data by the primitive element $\alpha$;

a plurality of gate circuits, said gate circuits each operable to AND bit data of input data and output data of each of said coefficient units; and a gate circuit operable to exclusive-OR respective output data of said plurality of gate circuits.

19. A Reed Solomon coding apparatus as claimed in claim 18, wherein each of said coefficient units comprises:

a plurality of registers operable to shift bits other than the most significant bit of the input data to be multiplied and hold bit-shifted data, and add zero as the lowest data to the bit-shifted data and output addition data; and a selector operable to receive the most significant bit of the input data as an input, and select and output an exclusive-OR of the primitive polynomial set value corresponding to a value of an $\alpha^m$ wherein a degree of a Galois field is m, m is an integer at least equal to 1, and one of primitive element is $\alpha$, output data of the registers when the most significant bit is 1, and select and output the output data of the registers when the most significant bit is zero.

20. A Reed Solomon coding apparatus comprising:

a generator polynomial coefficient generation device operable to receive a generator initial value corresponding to a primitive element with a minimum power of roots corresponding to powers of $\alpha$ which are obtained by setting a generator polynomial to be zero, and a number t of errors to be corrected, t being an integer at least equal to 1, and expand the generator polynomial according to a change of the generator initial value and the number t, to generate coefficient data comprising coefficients of respective degrees; and a data coding device operable to receive information data and the coefficient data as inputs, wherein a maximum number of errors to be corrected is s, s being an integer at least equal to t, and said data coding device comprises:

a 0th multiplier operable to perform multiplication on a value of a 0th degree of the coefficient data of the generator polynomial and the information data;

a 0th register operable to hold output data of said 0th multiplier;

a (2M−1)-th multiplier operable to perform multiplication on a value of a (2M−1)-th of the coefficient data of the generator polynomial and the information data, wherein $s-1 \geq M \geq 1$ and M is an integer;

a 2M-th multiplier operable to perform multiplication on a value of a 2M-th degree of the coefficient data of the generator polynomial and the information data;

a (2M−1)-th adder operable to perform addition on output data of said 2M-th multiplier and data held in a (2M−1)-th register;

a 2M-th selector operable to select one of output data of said (2M−1)-th adder and output data of said 2M-th multiplier;

a 2M-th register operable to holds output data of said 2M-th selector;

a (2s−1)-th multiplier operable to perform multiplication on a value of a (2s−1)-th degree of the coefficient data of the generator polynomial and the information data;

a (2s−2)-th adder operable to perform addition on output data of said (2s−1)-th multiplier and data held in a (2s−2)-th register; and a (2s−1)-th register operable to hold output data of said (2s−2)-th adder;

wherein a (2(s−t))-th selector is operable to select output data of a (2(s−t))-th multiplier, with respect to the number t of errors to be corrected, and the output and the information data are coupled to form Reed-Solomon coded data.

21. A Reed Solomon coding apparatus as claimed in claim 20, wherein said multipliers each are operable to receive a primitive polynomial set value corresponding to a value of an $\alpha^m$, wherein a degree of a Galois field is m, m is an integer at least equal to 1, and one of primitive element is $\alpha$, as inputs, and comprises coefficient units serially connected in (m−1) stages, said coefficient units each operable to perform multiplication on the primitive element $\alpha$ by using a combination of a bit-shifted primitive element $\alpha$ and an exclusive-OR of the bit-shifted primitive element $\alpha$ and the primitive polynomial set value $\alpha^m$.

22. A Reed Solomon coding apparatus as claimed in claim 21, wherein said coefficient units each are operable to output a vector value obtained by shifting a vector value of the generator initial value by one bit to the left every time it performs multiplication on the primitive element $\alpha$, and when the most significant bit is 1, said coefficient unit is operable to output an exclusive-OR of the bit-shifted primitive element $\alpha$ and the primitive polynomial set value $\alpha^m$ when a corresponding degree increases.

* * * * *